United States Patent
Lucas et al.

(10) Patent No.: US 6,505,087 B1
(45) Date of Patent: Jan. 7, 2003

(54) MODULAR SYSTEM AND ARCHITECTURE FOR DEVICE CONTROL

(75) Inventors: Peter Lucas, Pittsburgh, PA (US); Jeffrey Senn, Pittsburgh, PA (US); Joseph Ballay, Pittsburgh, PA (US); Noah Guyot, Pittsburgh, PA (US)

(73) Assignee: Maya Design Group, Pittsburgh, PA (US)

( * ) Notice: Subject to any disclaimer, the term of this patent is extended or adjusted under 35 U.S.C. 154(b) by 213 days.

(21) Appl. No.: 09/585,450

(22) Filed: Jun. 2, 2000

Related U.S. Application Data

(63) Continuation of application No. 08/967,752, filed on Nov. 10, 1997, now Pat. No. 6,144,888.

(51) Int. Cl.⁷ .............................................. G05B 15/00
(52) U.S. Cl. ............................ 700/83; 700/17; 700/19; 700/23; 700/86; 700/87; 700/88; 345/156; 345/169; 345/166
(58) Field of Search ........................... 700/3, 9, 17, 19, 700/23, 83–88, 90, 78, 79, 219, 220; 345/156, 169, 166; 361/735, 796, 797, 803; 29/463, 469, 854, 876

(56) References Cited

U.S. PATENT DOCUMENTS

| 4,567,557 A | 1/1986 | Burns ......................... 364/145 |
| 4,665,544 A | 5/1987 | Honda et al. ................ 379/104 |
| 5,051,720 A | 9/1991 | Kittirutsunetorn .......... 340/310 |
| 5,086,385 A | 2/1992 | Launey et al. ............... 364/188 |
| 5,132,679 A | 7/1992 | Kubo et al. ............. 340/825.22 |
| 5,142,469 A | * 8/1992 | Weisenborn .................. 700/17 |
| 5,170,252 A | 12/1992 | Gear et al. ................... 358/181 |
| 5,218,552 A | 6/1993 | Stirk et al. ................... 364/492 |
| 5,329,431 A | 7/1994 | Taylor et al. .................. 362/85 |
| 5,406,472 A | 4/1995 | Simmons et al. ........... 364/133 |
| 5,410,326 A | 4/1995 | Goldstein .................... 348/134 |
| 5,418,527 A | 5/1995 | Yashiro ................. 340/825.24 |
| 5,457,446 A | 10/1995 | Yamamoto ............. 340/825.24 |
| 5,457,478 A | 10/1995 | Frank ......................... 345/158 |
| 5,500,794 A | 3/1996 | Fujita et al. ................. 364/188 |
| 5,745,116 A | * 4/1998 | Pisutha-Arnond ........... 345/821 |
| 5,757,680 A | * 5/1998 | Boston et al. ................. 379/21 |
| 5,898,831 A | * 4/1999 | Hall et al. ................... 713/201 |
| 5,909,183 A | * 6/1999 | Borgstahl et al. ........ 340/10.51 |
| 5,917,493 A | * 6/1999 | Tan et al. .................... 345/835 |
| 5,971,591 A | * 10/1999 | Vona et al. ............. 219/121.54 |
| 6,144,888 A | * 11/2000 | Lucas et al. .................. 29/463 |

OTHER PUBLICATIONS

*Machine Design, Control Networks For The Home*, Oct. 20, 1983, pp. 109–112.

* cited by examiner

Primary Examiner—Ramesh Patel
(74) Attorney, Agent, or Firm—Morgan, Lewis & Bockius LLP

(57) ABSTRACT

An architecture and electric system for controlling various devices is disclosed. The system uses modular, interchangeable components that can perform one or several tasks, such as interacting with a human user, controlling an external device, communicating and managing communications between several modules, storing and retrieving information, and acting as a master module. The modules are stackable and can interface with any other module.

3 Claims, 26 Drawing Sheets

EXAMPLE: DATA FLOW IN STACK
• WITH CONTROL MODULE
• DATA ARE PASSED THROUGH CONTROL MODULE BEFORE (OPTIONALLY) TO EXTERNAL CONTROL DEVICE

MODULAR SYSTEM AND ARCHITECTURE FOR DEVICE CONTROL

This is a continuation of application(s) application Ser. No. 08/967,752 filed on Nov. 10, 1997, now U.S. Pat. No. 6,144,888.

BACKGROUND OF THE INVENTION

1. Field of the Invention

The present invention relates to a system for controlling devices and for distributing information, and more particularly, to a system used in home automation for controlling various devices, such as lights, HVAC, security, and audio/video devices.

2. Discussion of the Related Art

As more and more products become available that are controlled by microprocessors and computerized systems, there is an increasing need to interconnect these devices and to control and coordinate their operation.

For example, a modem home may contain a security system consisting of an alarm, security cameras, and motion detectors; entertainment devices such as VCRs, TVs, audio amplifiers, speaker distribution systems, and remote control devices; communications devices such as corded and cordless telephones, answering machines, and caller id devices; electronic lighting and heating controls; and many other electronic and electro-mechanical devices. There is a great need to control and partially automate the use of these devices in a way that is simple, consistent, and convenient for the user.

Similarly, in a multimedia classroom, museum exhibit, or conference room there may be a need to control lighting, motorized window drapes, multiple VCRs, video projectors, and sound systems, as well as to distribute audio and video signals among multiple sources and destinations.

Many of the devices involved in such systems have several common characteristics:

- a) It is generally possible to control the devices via either a simple communications port provided as part of the device (such as an IR remote control input of a VCR, an RS-232 port on a laser disk player, a keypad input of a security panel or a low-voltage relay input of a drapery controller) or via an external device (such as a computer-controllable lighting dimmer panel).
- b) The aggregate bandwidth needed to control even a large number of devices is very low. A few bytes of data are generally sufficient to change the state of any such device.
- c) The interfaces to these devices are generally quite simple but highly variable from device to device; the variability is due to lack of standardization.

It is often difficult or impossible to control large numbers of devices from a centralized device, such as a personal computer. The difficulty is due to the large number of I/O ports necessary, ports which are often in short supply on typical personal computers.

Previous efforts at providing coordinated control for such devices have generally taken one of three approaches:

- a) Attempts to define universal standards for the external interfaces for these devices. These standards generally have taken the form of distributed control networks (such as Echelon's LONWorks, CEBus, or SmartHouse). However, the universal adoption of any such standard is questionable, and in any event is a long way off.
- b) The creation of products that combine the ability to control many such devices in a single package. For example, home-automation devices are available that can send and receive IR remote control commands, control home heating and security devices, and interface to lighting controllers. Although these devices are often somewhat modular, they are characterized by a limited set of pre-defined interface options, and typically have a fixed set of "slots" reserved for optional I/O boards. This has the disadvantages of requiring consumers to purchase functionality that they may not require and the interface may not be readily extensible to new or unanticipated requirements.
- c) Distributed multimedia control systems, such as the AMX Axcess system. These systems are characterized by proprietary low-bandwidth control networks combined with special-purpose devices for each control function (such as relay boxes and lighting controllers). This approach tends to be expensive because each special-purpose control device is custom engineered and has its own packaging, power supply, and interface requirements. In addition, these devices are typically pure control networks and are not readily extensible to the distributed control and access to other media types, such as voice and video.

Another concern is the great expense involved in bringing even a very simple new technology product to a manufacturable state. As integrated circuits become more powerful, more flexible, smaller, and less expensive an increasing percentage of the total costs of many new products are incurred, not in providing the basic functionality of the product, but rather in ancillary matters. Often the entire function of a simple electronic device can be realized in a single off-the-shelf micro controller chip costing just cents per unit. To bring such a product to market, however, may require hundreds of thousands of dollars in tooling, mechanical engineering, package design, development of interface and control protocols. Such expenses often render otherwise viable niche products economically infeasible. There is a need to address this problem by developing a standard platform on which a variety of inter-operable electronic devices can be built, without incurring the prohibitive engineering costs.

The variety of specific combinations of functions and features required to satisfy the widely varied requirements of users is growing more rapidly than the ability of the market to supply such combinations. Furthermore, in an effort to meet widely varied requirements, manufacturers have been forced to add more and more specific features to each product. This has led to increased complexity and cost of products, and users have been forced to purchase complex, feature-laden products even if their need is for only a small subset of the features included in a package.

Previous workers have been deterred from making these improvements because virtually all attention in the area of communications architectures has been directed at the high-end of the market; concentrating on higher and higher communications bandwidth and highly general large scale networking schemes. The value of applying simpler, mature technologies to fill a large collection of lower-end needs in a very general way has not generally been recognized.

Moreover, at present it is difficult to augment other hardware devices with additional capability not originally built into the device. For example, in interactive video applications the set-top-box device supplied by the service provider may have only a limited amount of memory, display, or I/O capability. The memory limitation also limits the range of software applications that can be offered by the provider. For instance, an electronic mail application may require external non-volatile memory to store incoming mail messages; a home shopping application may require a credit-card reader to be attached to the device; and an enhanced telephony service might require the attachment of a cordless phone and caller-ID functions.

SUMMARY OF THE INVENTION

Accordingly, the present invention is directed to a control system that substantially obviates one or more of the problems due to limitations and disadvantages of the related art.

An object of the present invention is to provide a system for increased flexibility and ease in configuring and assembling combinations of hardware and software by users and systems integrators into new ensembles unanticipated by the manufacturer.

Another object of the present invention is to provide a set of simple modules that can be composed by systems integrators or end users into unique configurations to address applications in niche markets that would not be economical to address with conventionally packaged products.

Another object of the present invention is to provide a standard package that permits a diverse range of highly specific hardware enhancements to be added to a base device to support the needs of particular applications.

This invention solves the above problems by providing a standardized package in which a great diversity of simple electronic devices and interfaces can be manufactured. This package provides the following standard features:

a. A common, customizable form and a standardized shell made of plastic or other material suitable for containing a diversity of simple electronic products.

b. The ability to "stack" any number of such devices such that they can all communicate with each other and with a host computer or control system through a single communications port.

c. Standardized protocols for communicating among devices and between devices and external computing devices. These protocols are optimized for low cost and maximum flexibility rather than on maximum performance.

d. A multi-channel audio-video communications bus, permitting the interchange of multimedia data among devices.

e. Control modules capable of automating the operation of multiple devices without the intervention of an external computing device.

f. Interface modules capable of providing I/O capability to collections of modules, allowing users to interact with such collections, forming "custom appliances" unanticipated by the manufacturer of the modules.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the modular system for controlling electronic devices comprises at least two shells, each shell for holding an electronic device, wherein each shell comprises a first side and second side, the first side having a first shape and a first gender-specific connector and the second side having a second shape that is opposite the first shape and a gender-specific connector that is opposite that of the connector on the first side such that one shell can be mated and stacked on the other shell; mounting means for mounting the shells; and control means for controlling operations of electronic devices and allowing communication between the electronic devices.

In another aspect, the modular system for controlling electronic devices comprises at least two shells, each shell for holding an electronic device, wherein each shell comprises a first side and second side, the first side having a first shape and the second side having a second shape that is opposite the first shape such that one shell can be mated and stacked on the other shell, the second side having a gender-specific connector that is opposite that of the connector on the electronic devices; mounting means for mounting the shells; and control means for controlling operations of electronic devices and allowing communication between the electronic devices, wherein the control means includes a master module and at least one of an I/O slave module, a control module, a memory module, a human interface module, a video module or an audio module.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

OVERVIEW

The present invention relates to a modular system permitting non-technical users to assemble collections of low-level digital logic and interface hardware into custom configurations. The price of low-end microprocessors has become so low that the need for custom hardware configurations is better served by modular configurations of microprocessors rather than modules implemented in discrete logic. The same microprocessors that implement the modular logic system also support a significant range of I/O, control, and computational functions at little or no additional hardware cost. This modular architecture is easily extended to support the control and distribution of multimedia information, such as audio and video in a highly compatible and integrated manner. As a result, the invention is an extremely general vehicle for the coordinated control of many different kinds of electronic devices.

The invention generally includes a series of modules that can be plugged together, one into the next, in any combination and number. When the modules are plugged together, they comprise a bus capable of passing data and multimedia information, both digital and analog, among the modules in arbitrary combinations. Such a collection of interconnected modules is known as a "stack."

In a preferred embodiment, modules all share a common form and electrical specifications, thus ensuring that any set of modules that are needed together can be readily composed into a system, even if the need to use the modules together was not previously anticipated. A number of optional mechanical and electrical features are designed into the standard module specifications; however, the design is also extensible, both mechanically and electrically so that additional common features can be defined in the future without sacrificing backward compatibility with existing modules.

An important aspect of the invention is the fact that the modules are self-stacking in that they plug directly into each other, rather than plugging into a common backplane. In this way, the modules can be used in many different configurations, ranging from only one or two modules sitting on a desktop or attached to a controlling device, up to a large number of modules mounted on a wall or an equipment rack.

Although all modules share common electrical and mechanical specifications and can all inter-operate, they may exist in many different varieties, each implementing a specific set of functions. The invention contemplates the use of several general classes of modules discussed briefly below and in greater detail later.

Figure 14:
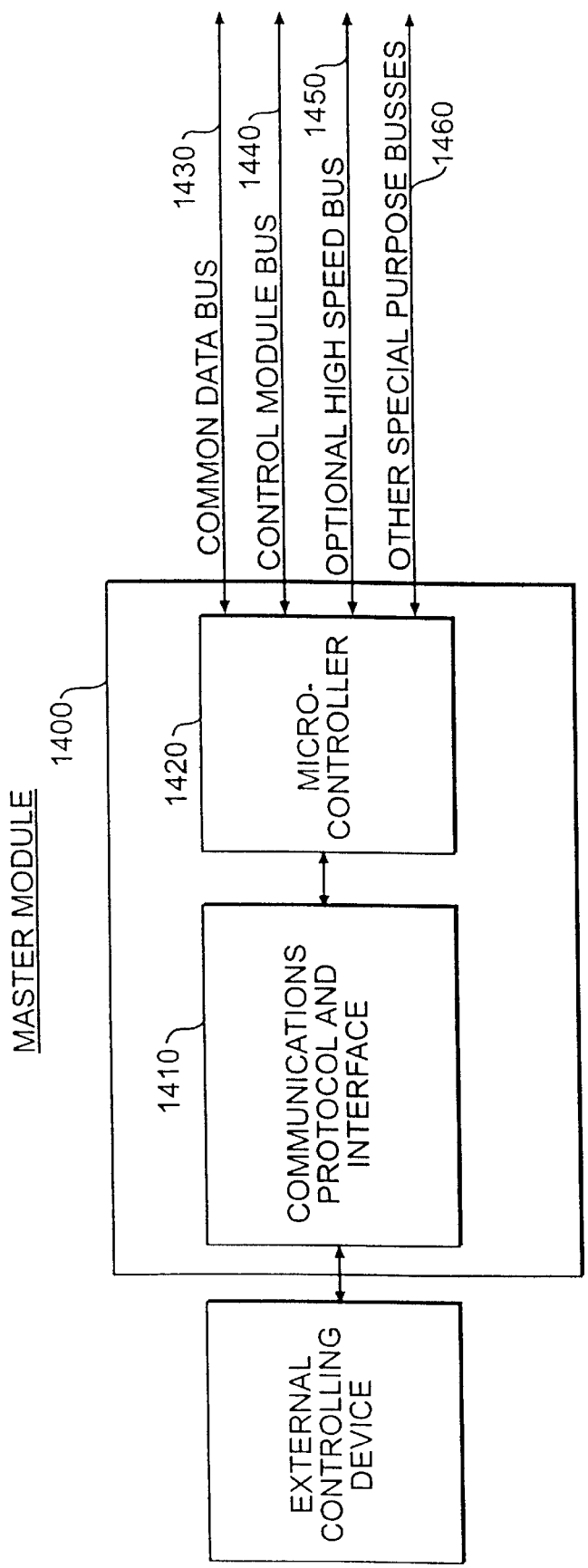
FIG. 14 is a block diagram illustrating a master module.

A. Master Module. This module has the responsibility for coordinating the intercommunication of all the other modules in a stack. The master module also may optionally manage communications between modules in the stack and external devices, such as personal computers. Each stack has exactly one master module. FIG. 14 shows a schematic diagram of a preferred master module.

B. I/O Slave Modules. In addition to their connection to other modules via the stack bus, these modules have connections to external devices that they control or with which they communicate. These connections may be hardwired via electrical connectors, or may be via wireless channels such as radio frequency (RF) or infrared links (IR). These connections may be analog, digital or both. See FIG. 15.

C. Control Modules. These modules contain program memory and processor logic that permit them to establish virtual interconnections among modules and to automate the operation of modules and devices connected to them. See FIG. 16.

D. Memory Modules. These modules contain memory (such as electronic or magnetic) and are used primarily to store information. Memory modules can be used as auxiliary storage for other modules in a stack, or can come pre-loaded with useful information such as a list of telephone numbers or a dictionary. See FIG. 17.

E. Human Interface Modules. These modules contain controls and/or displays permitting users to interact with the system. Such controls may consist of switches, knobs, keyboards or other physical controls; loudspeakers, microphones, or other transducers; and/or indicator lights, alphanumeric displays, graphical screens, or other visual displays. These controls may be (1) integral to the module; (2) connected to it via a wired link; or (3) connected to it via a wireless link, such as an RF or IR channel. See FIGS. 18 and 19.

Although modules may be implemented using discrete logic, in the preferred embodiment of the present invention, each module contains an inexpensive micro controller that handles all communications between that module and other modules.

In the preferred embodiment, modules are designed to be "hot plugged" such that slave modules may be added to or removed from the stack while the stack is in operation. The master module will detect such changes and report the configuration to the attached host and/or other modules, permitting automatic reconfiguration of controlling software.

The invention will now be described in greater detail with reference to the Figures. The discussion will begin with the structure or hardware aspects of the invention and then the specification will discuss the operational features of the present invention.

HARDWARE

I. Physical Packaging

The physical packaging of modules is designed to permit a number of flexible configurations while still allowing all combinations of modules to be interconnected. The self-stacking "no-backplane" design of the modules permits maximum flexibility in configuring sets of modules into functional devices.

Figure 1:
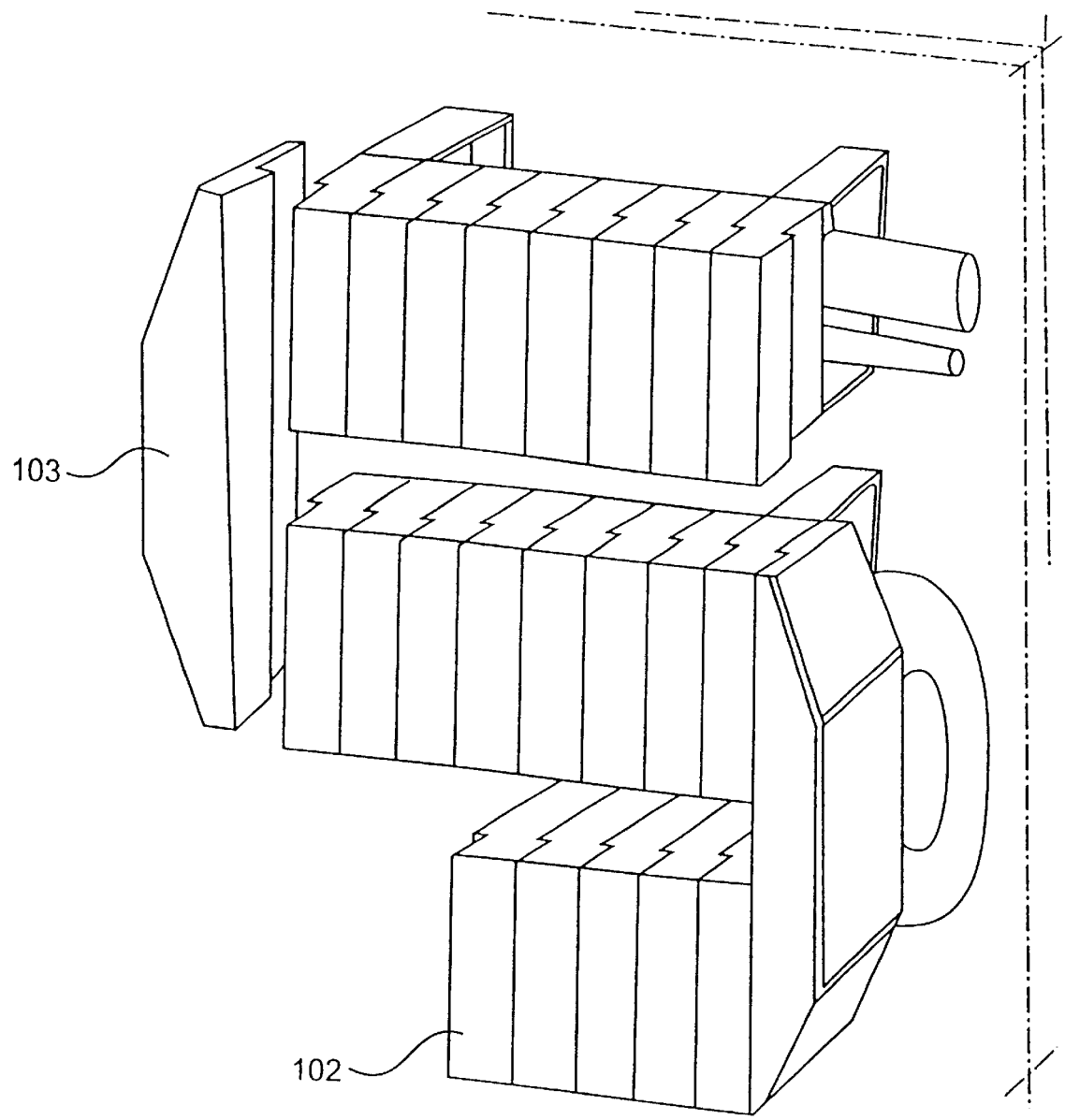
FIG. 1 is an S-shaped stack.
Figure 2:
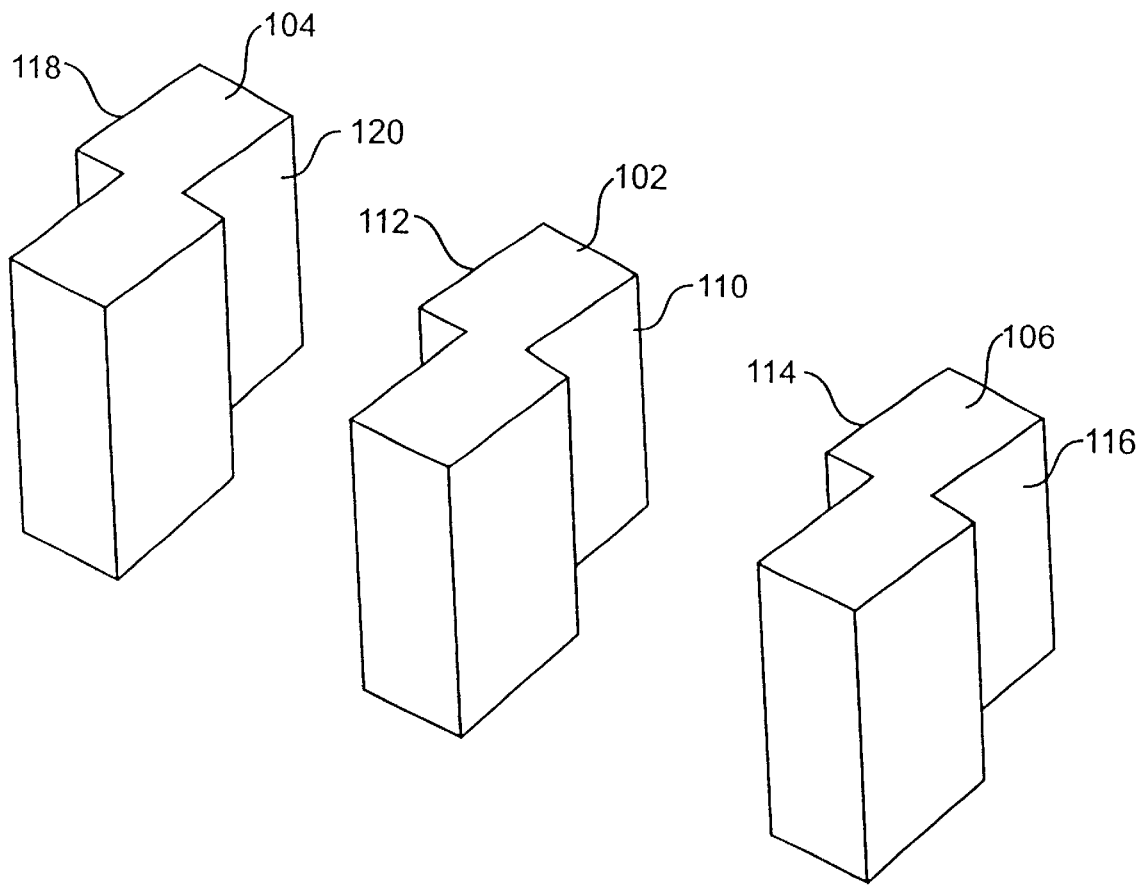
FIG. 2 is an isometric view of several modules.

A preferred embodiment of the invention is shown in FIGS. 1 and 2. Individual modules 102, 104, and 106, shown in FIG. 2, have exterior features that allow them to stack in both directions and facilitate easy and inexpensive manufacture. Consider two adjacent modules 102 and 106. Module 102 has a first side 112 and a second side 110. Likewise, module 106 has a first side 114 and a second side 116. As shown in FIG. 2, the second side 110 of module 102 is adjacent to the first side 114 of module 106. FIG. 2 also, illustrates that the first side 114 of module 106 is designed to mate with, or match with the second side 110 of module 102.

To facilitate easy and inexpensive manufacture, modules 102, 104 and 106 have similar shapes. This allows the modules 102, 104 and 106 to be cast from a single mold or be produced without the need to retool for each different module. Because modules 102, 104 and 106 share similar exterior shapes, the first side 114 of module 106 is substantially similar to the first side 112 of module 102. Many other correspondences and similarities between the various modules will be apparent to those skilled in the art. For example, the first side 114 of module 106 is substantially similar to the first side 118 of module 104. It is also apparent that the modules 102, 104 and 106 can be assembled in any order. Further, there is no limit to the number of modules that can be added to this existing series of modules.

Figure 3:
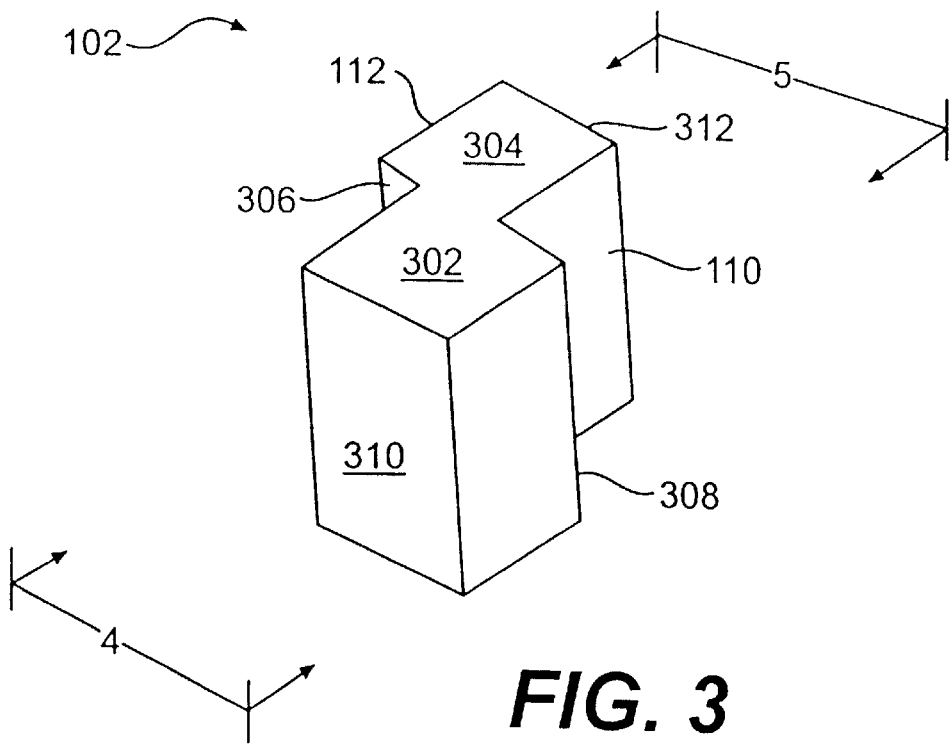
FIG. 3 is an enlarged isometric view of one module.

A single module will now be discussed in greater detail. Turning to FIG. 3, module 102 includes first side 112 and second side 110. A preferred embodiment of module 102 includes a stepped configuration. A forward portion 302 is offset from a rearward portion 304. This offset produces two additional faces, a second forward face 306 and a second rearward face 308. The second forward face 306 is disposed rearward of the first forward face 310, and the second rearward face 308 is disposed forward of the first rearward face 312.

Figure 4:
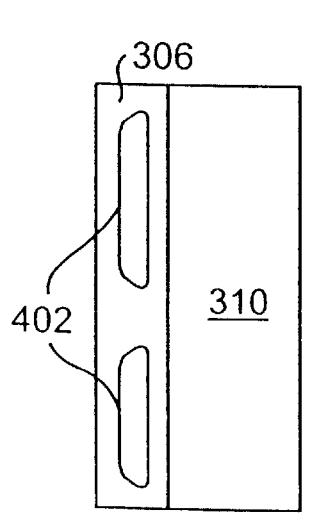
FIG. 4 is a front view of a module.
Figure 5:
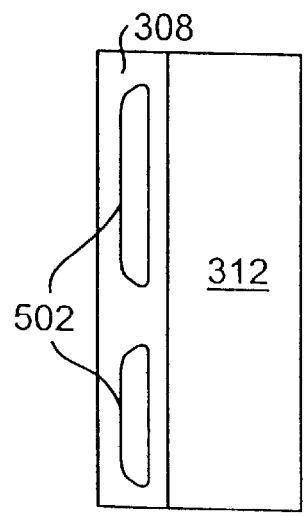
FIG. 5 is a rear view of a module.

Connectors that allow one module to communicate with another module are disposed on the second faces 306 and 308. Connector array 402, shown in FIG. 4, is disposed on face 306 and connector array 502, shown in FIG. 5, is disposed on face 308. The modules are designed to allow any two different modules to mate and connect. A preferred embodiment includes a consistent gender selection for the connector arrays. For example, if all of the modules have a connector array 402 that is male disposed on second face 306 and if all of the modules have a connector array 502 that is female designed to receive the male connector array 402 on face 308, any module can mate with any other module. The same is true if the genders of the connectors are reversed. As long as gender consistency is maintained among the various modules, all of the modules will be able to mate with any other module and all of the modules become interchangeable with all other modules. In other words, although the modules have "male" and "female" sides, all connections are duplicated such that the bus is logically hermaphroditic, i.e., the stack may extend in either direction relative to a given module.

A. The Connector

The invention provides inexpensive and compact electrical interconnection between the modules. By including presently unused pins, the invention also provides for the future addition of lines necessary to support unanticipated bus definitions. Moreover, any two modules can be plugged together regardless of how many optional pins are present or absent on either module.

Figure 6:
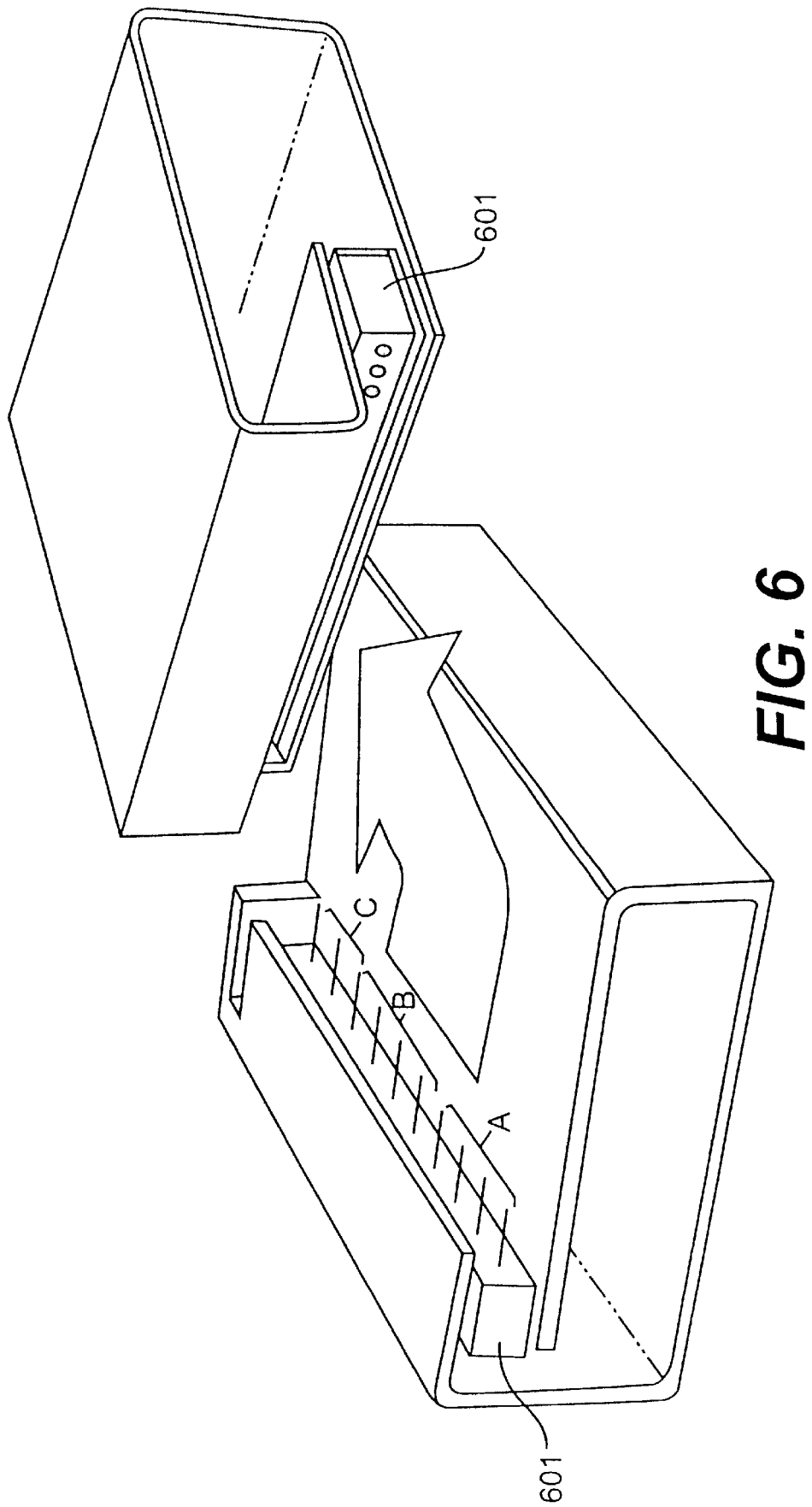
FIG. 6 is an enlarged view of a connector.

According to the preferred embodiment of the present invention, multiple compact pre-manufactured connectors 601 configured as shown in FIG. 6 are used. Therefore, the invention has the advantage of using an off-the-shelf connector design while still meeting all of objectives of the invention.

The interconnect busses are implemented using off-the-shelf connectors which, along with the previously-described shell, form an integrated, expandable connector system that provide for several logically distinct busses in a single, integrated physical package. The first interconnect bus contains all required signals and is the only one that is required to be implemented by all modules. The signals required for this bus are all carried in a single connector shown in FIG. 6 as part "A" connector. This connector also has a plurality of additional pins which can be used for other optional busses—both those currently anticipated and others whose need becomes apparent in the future. An example of known optional busses are the audio and video busses. In the preferred embodiment, a limited subset of this bus is implemented on the "A" connector, so that modules may implement these functions without the need of adding the optional part "B" connector. However, the majority of the audio and video functionality is implemented in the "B" connector, which is only required for modules needing this functionality. Similarly, the physical design of the shell permits the addition of subsequent part "C" connectors and so on, in order to meet future needs for newly defined busses.

The minimum module size is determined by the space requirements of the "A" connector. The actual size is determined by the needs of the particular module. The modules are designed so that modules of different heights and with differing numbers of connectors can be arbitrarily mixed in a stack. In addition, modules can be of arbitrary widths and/or thickness if extra space is required for internal components.

Connectors for external ports (and other devices such as antennas, IR receiver windows, etc.) are provided for via a removable bezel which can be customized for different kinds of modules. In this way, it is not necessary to modify the tooling of the basic case for each module type.

B. Mounting

Figure 7:
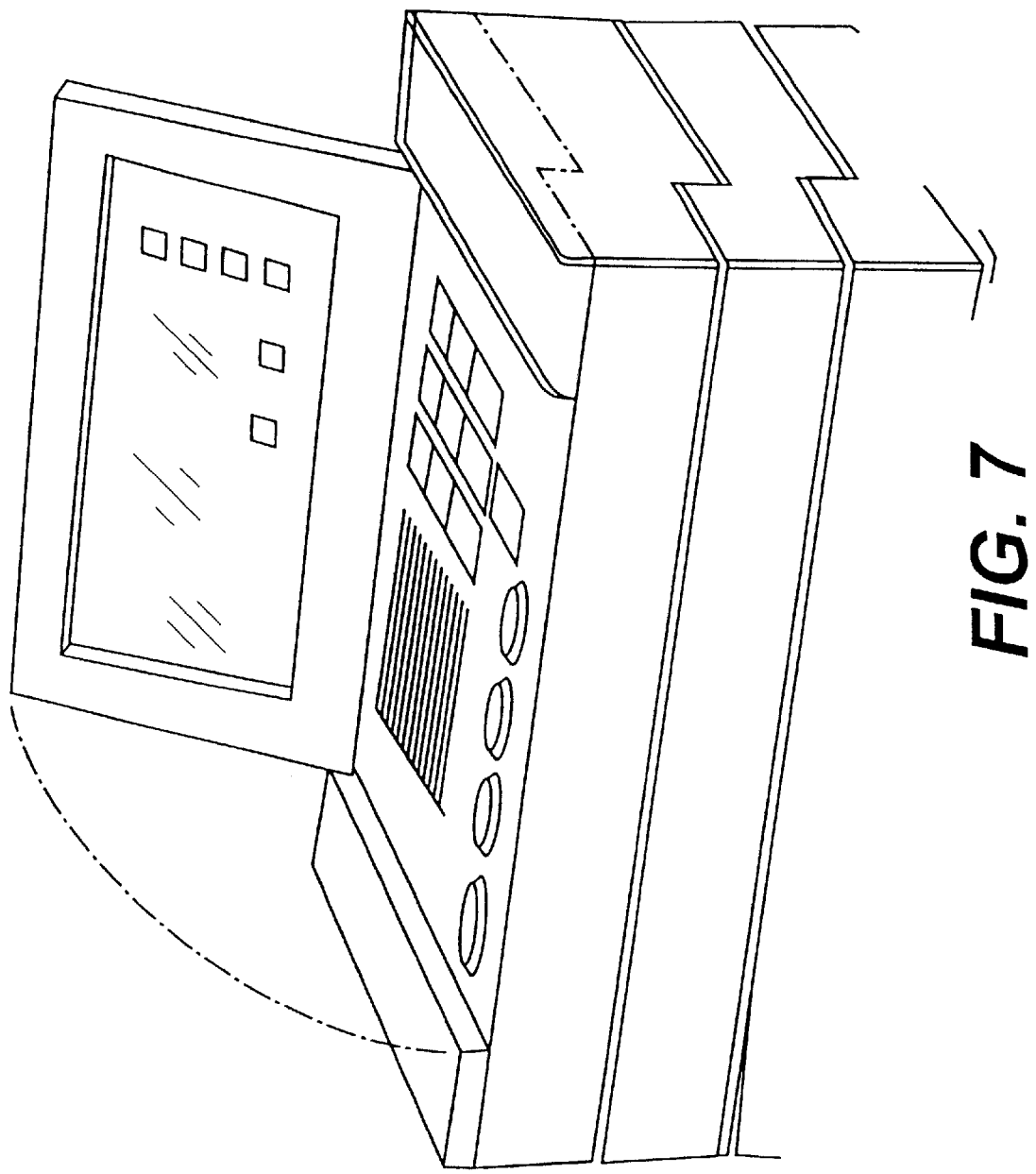
FIG. 7 is a human interface module.

Modules may be mounted in a number of ways, depending on the size of the stack and the physical nature of the installation. In a preferred embodiment, the stack may be mounted vertically, possibly with a human interface module on the top, thus forming an appliance-like configuration as shown in FIG. 7. Another embodiment may be that the stack may rest horizontally on a tabletop, with connectors exiting from the back.

Figure 8:
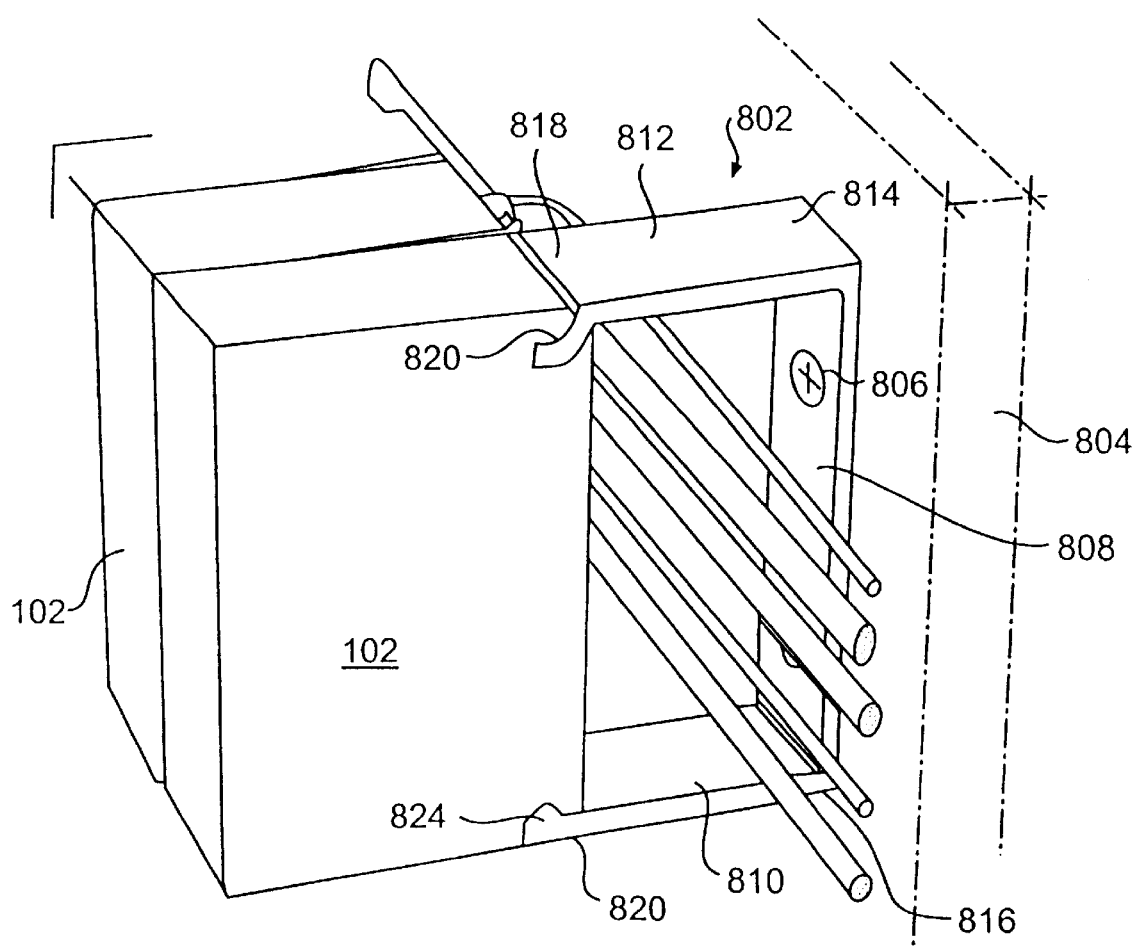
FIG. 8 is a module mounted with a bracket.

In another preferred embodiment, shown in FIG. 8, the modules can also be mounted to a wall or rack using optional brackets 802. These brackets permit neat and convenient permanent installation. The bracket 802 can be mounted to a support surface 804, a wall for instance, using any suitable connector, such as a screw 806; other suitable connectors are nail, adhesive, or any other mechanical, electrical, magnetic, or chemical connector. The bracket 802 includes a back wall 808 disposed near the support surface 804. The bracket also has an upper support arm 812 and a lower support arm 810. One end 814 and 816 of the support arms 812 and 810, respectively, is connected to the back wall 808. The other end 818 and 820 of the support arms 812 and 810, respectively, is used to hold modules 102.

The preferred bracket 802 has a pivot assembly 820. The pivot assembly 820 has an internal groove 824 cut into the curved outer portion of the upper arm 812 disposed on the outer end 818 of the upper support arm 812. The preferred bracket 802 also has a latch mechanism 824 disposed on the outer end 820 of the lower arm 810. The preferred latch mechanism 824 is a detent 826, shown in FIG. 9, formed on the module 102 that cooperates with a projection 828, shown in FIG. 9, disposed on the outer end 820 of the lower arm 810.

Figure 9:
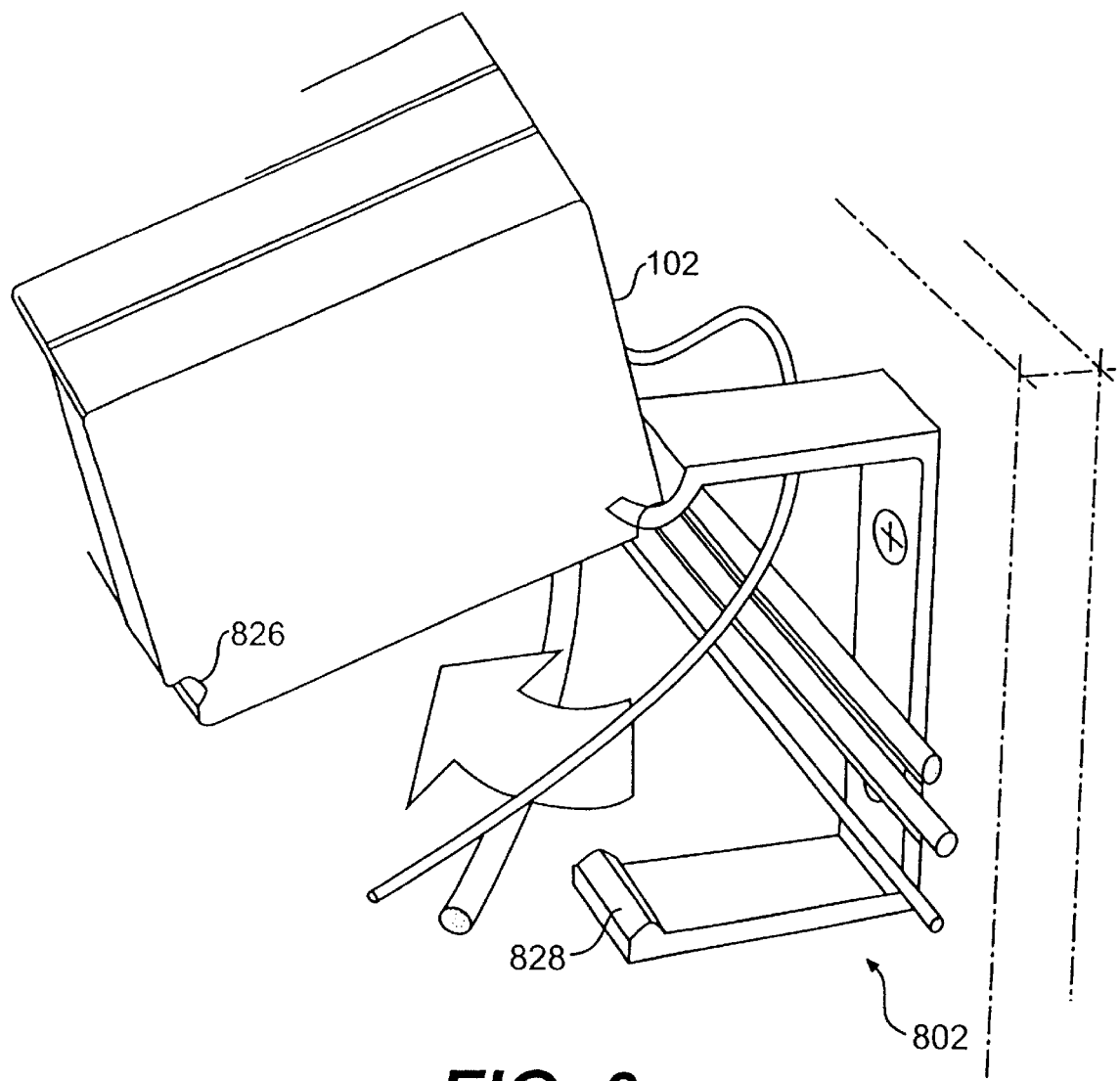
FIG. 9 is a module pivoted upwards.

Bracket 802 permits the easy attachment of modules and also allows a stack to be pivoted up as shown in FIG. 9, for access to cables and connectors without removing the entire stack from the wall.

Figure 25:
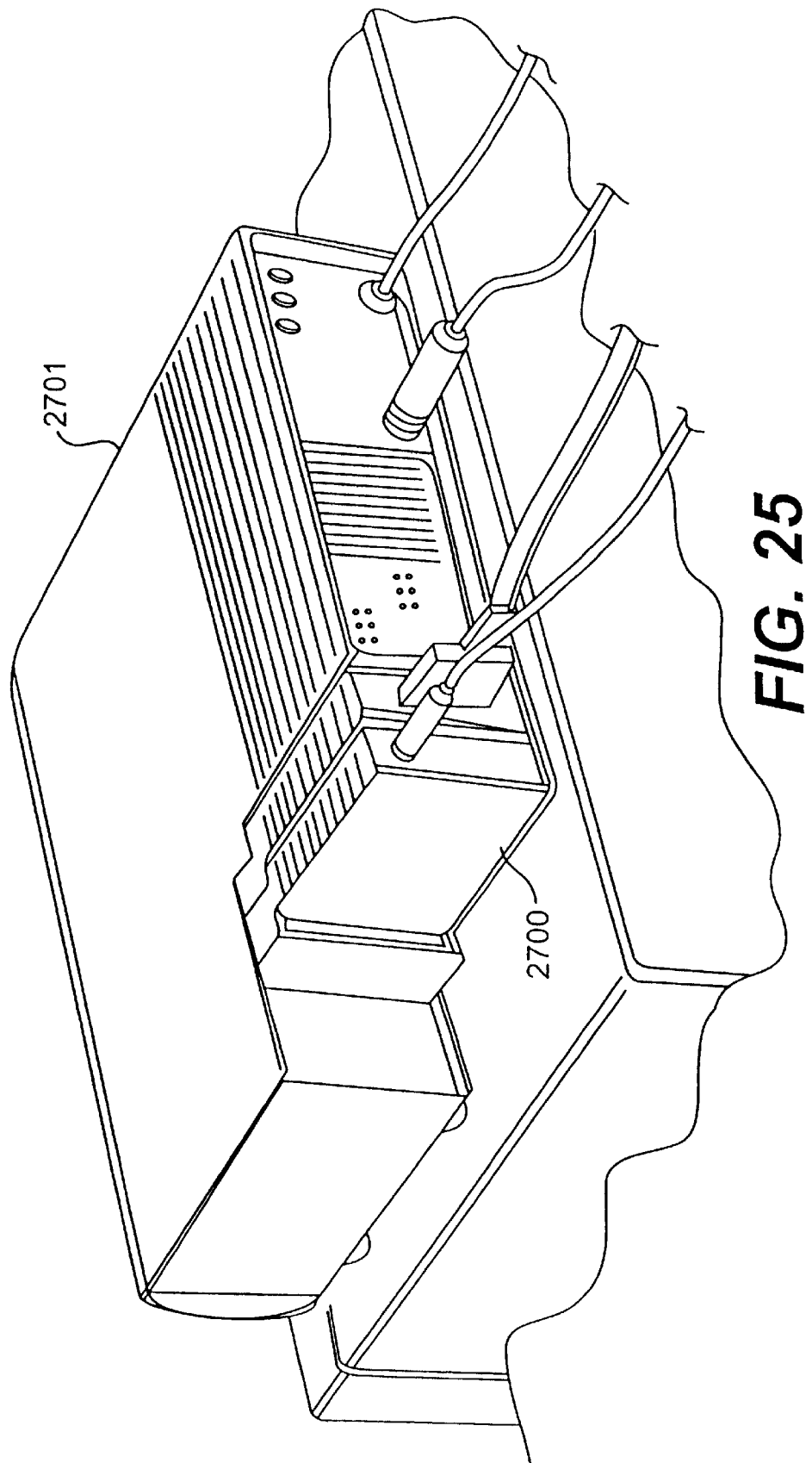
FIG. 25 illustrates modules being mounted to the side of a controlled device.

As shown in FIG. 25, the invention also contemplates the modules 2700 being mounted to the side of a controlled device 2701, such as a television, video cassette recorder, a security panel, a furnace, or a cable box. In this mode the stack can be used to extend the capabilities of the device.

Modules are able to be stacked together in either direction. This property permits large stacks of modules to be "wrapped" via special end modules 103, forming an S-shaped stack, without having any of the modules mounted "upside down," thus improving the compactness of large stacks, as shown in FIG. 1.

C. The Modules

1. The Master Module

FIG. 14 illustrates the master module 1400 of the present invention. The master module coordinates all intercommunication of the other modules in a stack, and may optionally manage communication between modules and external devices.

The master module optionally includes communications protocol and interface 1410. These can be, for example, RS 232, SCSI, or USB. The master module also includes a micro controller 1420 that controls the flow of information to and from the communications protocol and interface, and to and from other modules in the stack. Information to and from external devices, such as a personal computer is received by the communication protocol and interface 1410. The flow of information is achieved over bus lines. The master module supervises the function of the common data bus by generating tokens, arbitrating bus access, and other similar functions. It may optionally provide input/output capability between the common data bus and an external host. Although other special purpose busses can be used directly for communication among slave modules without the intervention of the master module, special master modules may be constructed which can participate in and/or arbitrate the use of such busses. For example, an "audio aware" master module could arbitrate the allocation of audio channels on behalf of several "audio aware" slave modules.

2. I/O Slave Module

Figure 15:
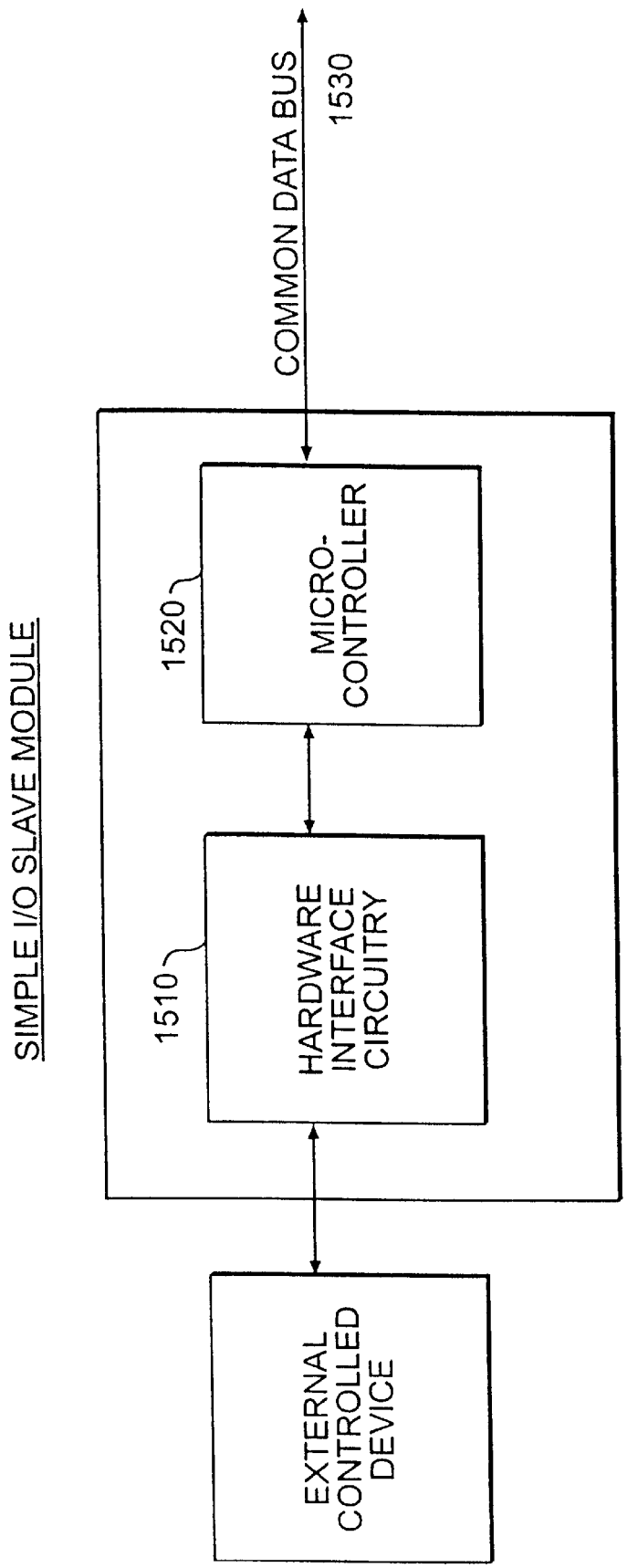
FIG. 15 is a block diagram illustrating and I/O slave module.

A slave module is shown in FIG. 15, and are modules within the stack that are controlled by the master module. One type of slave module is a 110 slave module whose purpose is to communicate with an external device. The 110 slave module includes hardware interface circuits 1510, which can be, for example, opto isolators or line drivers. Also included is a micro controller 1520 that controls the flow of information to and from the hardware interface circuit 1510. Information is received to the micro controller 1520 over a common data bus 1530, and is likewise sent from the micro controller 1520 over the common data bus 1530. The slave module also can control or communicate with an external device, such as a VCR or telephone. This connection can be via a wire or via wireless channels such as RF or IR links. For example, a telephony module may have an RJ-11 jack into which a standard telephone instrument may be plugged; a module may incorporate a 900 mhz radio transceiver that may be used to establish a wireless link with an external device such as a cordless telephone handset, etc.

3. Control Slave Modules

Control modules are capable of controlling the flow of information among the other modules in much the same way as is done by an external computer. Control modules send data to the other modules, receive data from other modules, and perform local computations. They also send and receive data through the base module to externally connected devices, such as personal computers.

Figure 16:
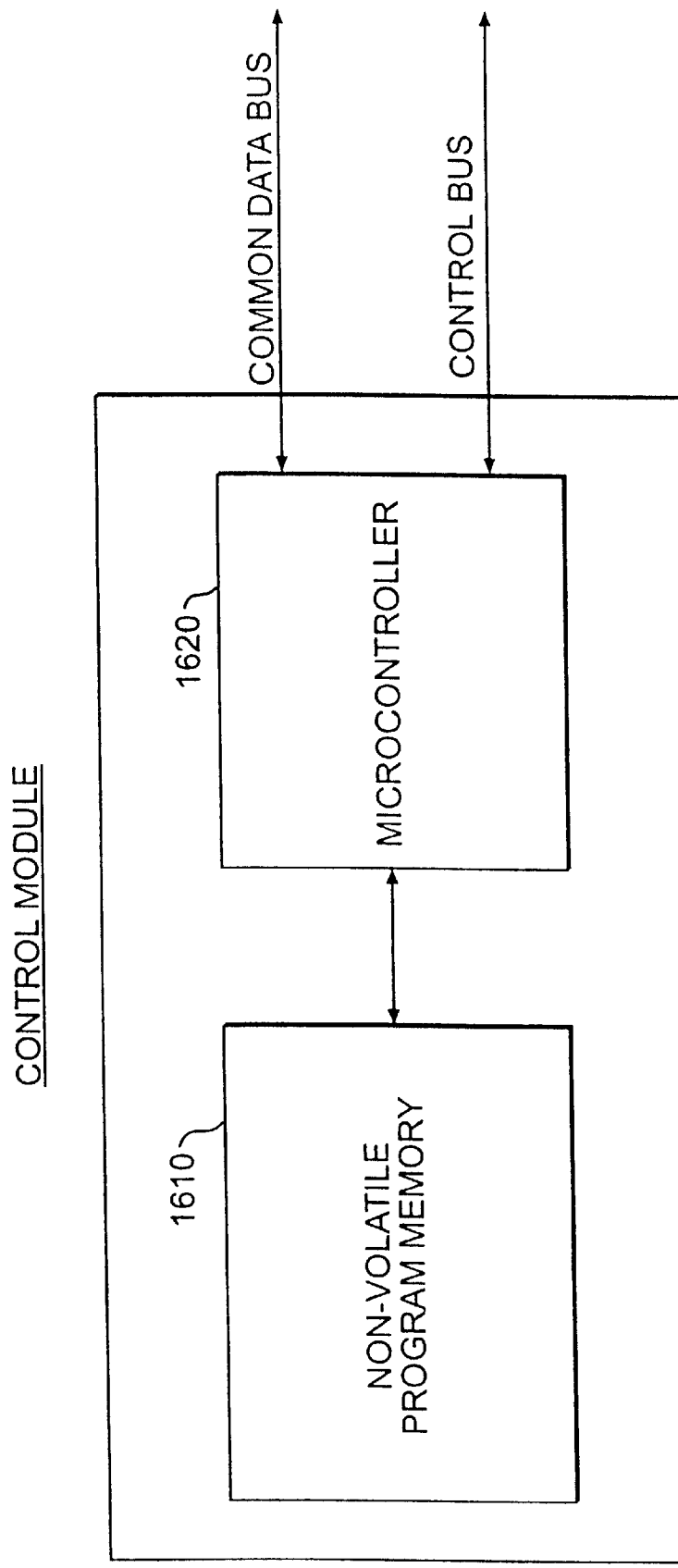
FIG. 16 is a block diagram illustrating a control module.

As shown in FIG. 16, control module 1600 contains a memory 1610 that is used to store program information and/or data. This memory may be read-only, and configured at the time the module is manufactured, it may be read/write and downloaded from the host via the base module, or it may be removable and provided by the user in the form of a cartridge, or other removable memory. Control module 1600 also include a micro controller 1620 that controls the flow of information.

4. Memory Slave Modules

Figure 17:
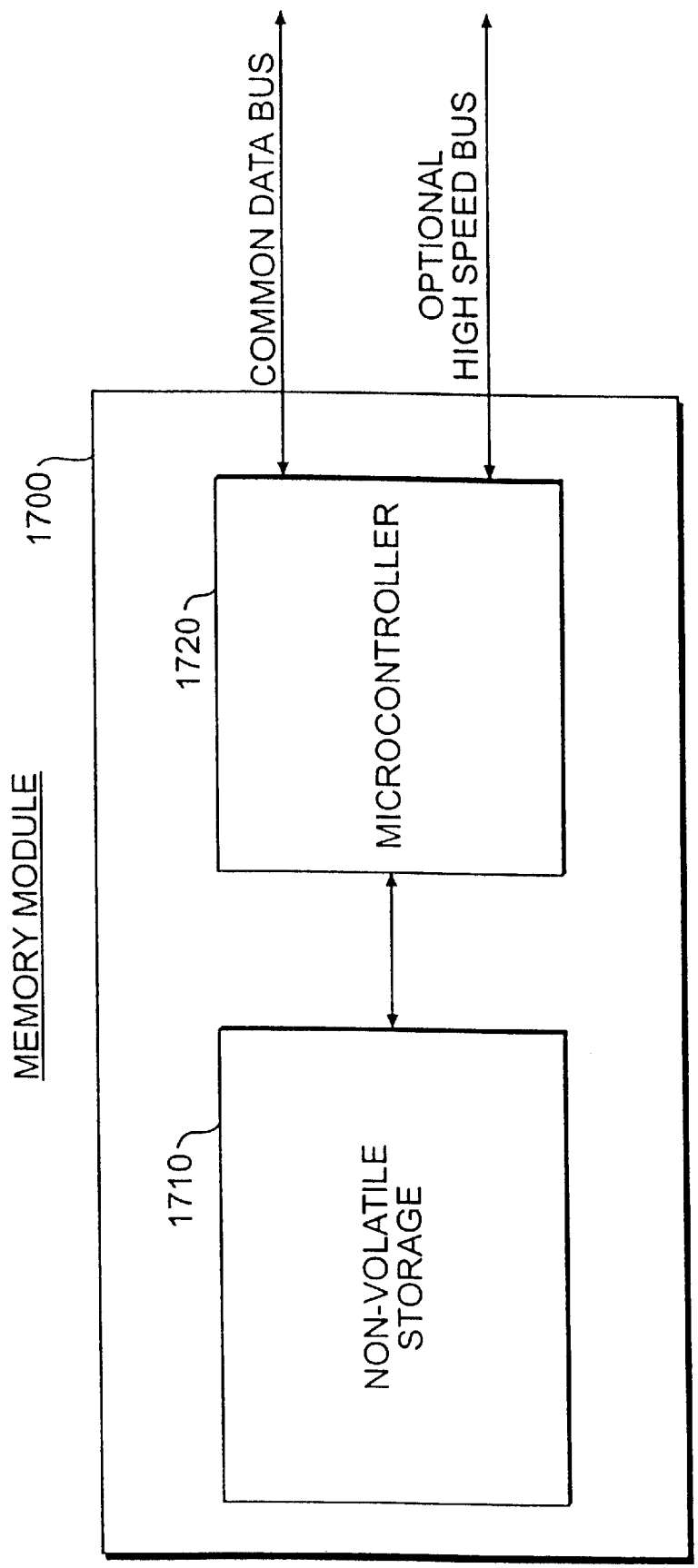
FIG. 17 is a block diagram illustrating a memory module.

FIG. 17 illustrates memory module 1700 of the present invention. A memory module contains a electronic or magnetic memory 1710 which makes it capable of storing and delivering information to and from other modules and external computing devices.

The electronic or magnetic memory 1710 can be, for example flash memory, EPROM, or a disk drive. Control of the memory 1710 is performed by microcomputer 1720. Although any well-known memory access scheme may be used (e.g., a file system), in the preferred embodiment, memory modules are implemented as "attribute-value engines" that accept named messages for storage, and return the messages. These modules may be programmed in the field during the operation of a stack, which may be used, for example, in an interactive television set-top-box electronic mail application, since many set-top-boxes have very little internal memory for storing messages. A memory module attached to the box may be used to store received messages for later viewing by the user.

Memory modules also may be programmed by a manufacturer with useful information, thus serving as a delivery vehicle for such information. For example, a module may be pre-programmed with telephone numbers for use with a stack capable of automatic dialing. In another example, useful reference material such as dictionaries, address-lists, etc. may be delivered to personal computer users via preprogrammed memory modules. Memory modules may also contain control programs to be executed by control modules.

5. Human Interface Slave Modules

Figure 10:
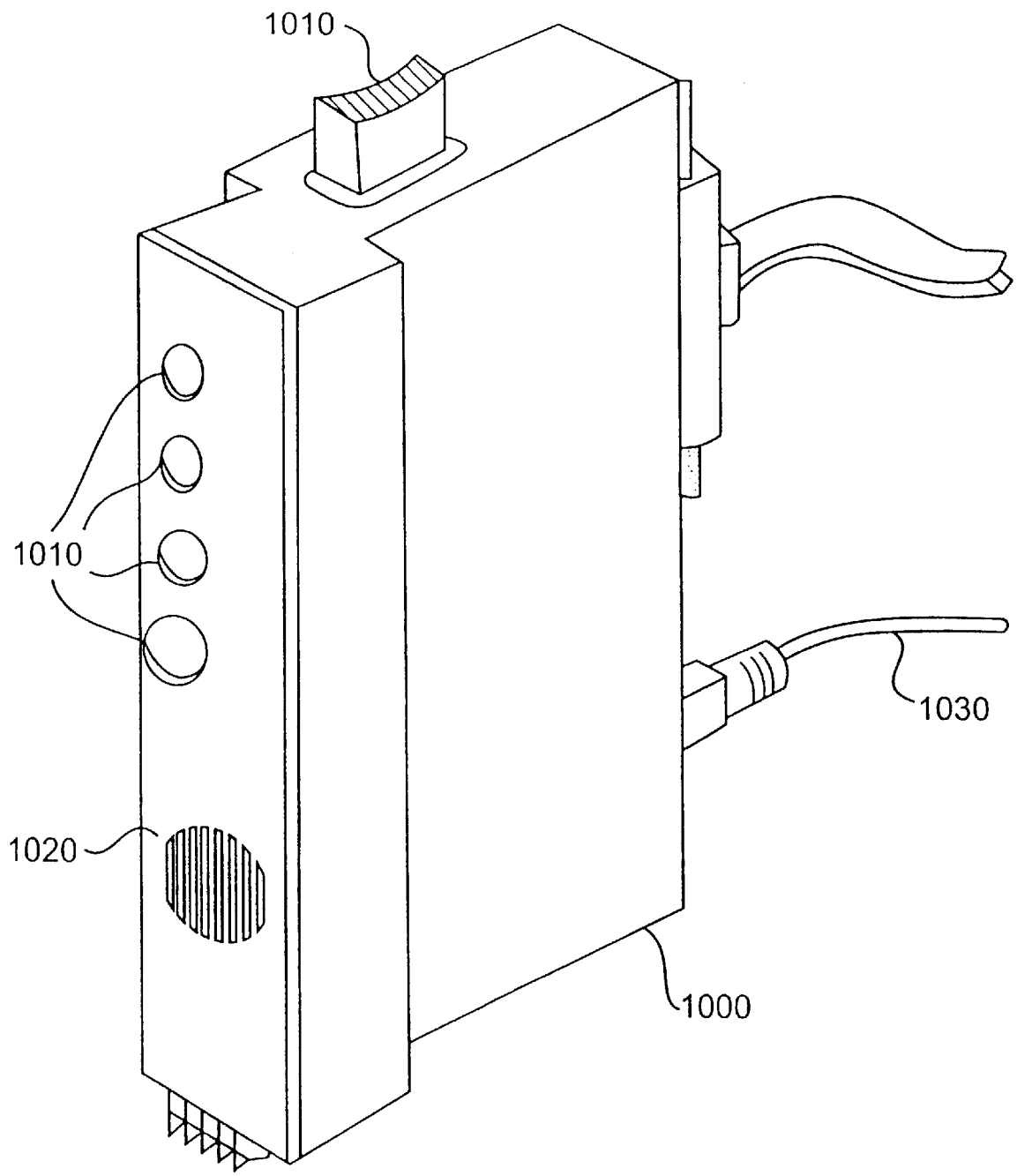
FIG. 10 is a module with human interface features.
Figure 18:
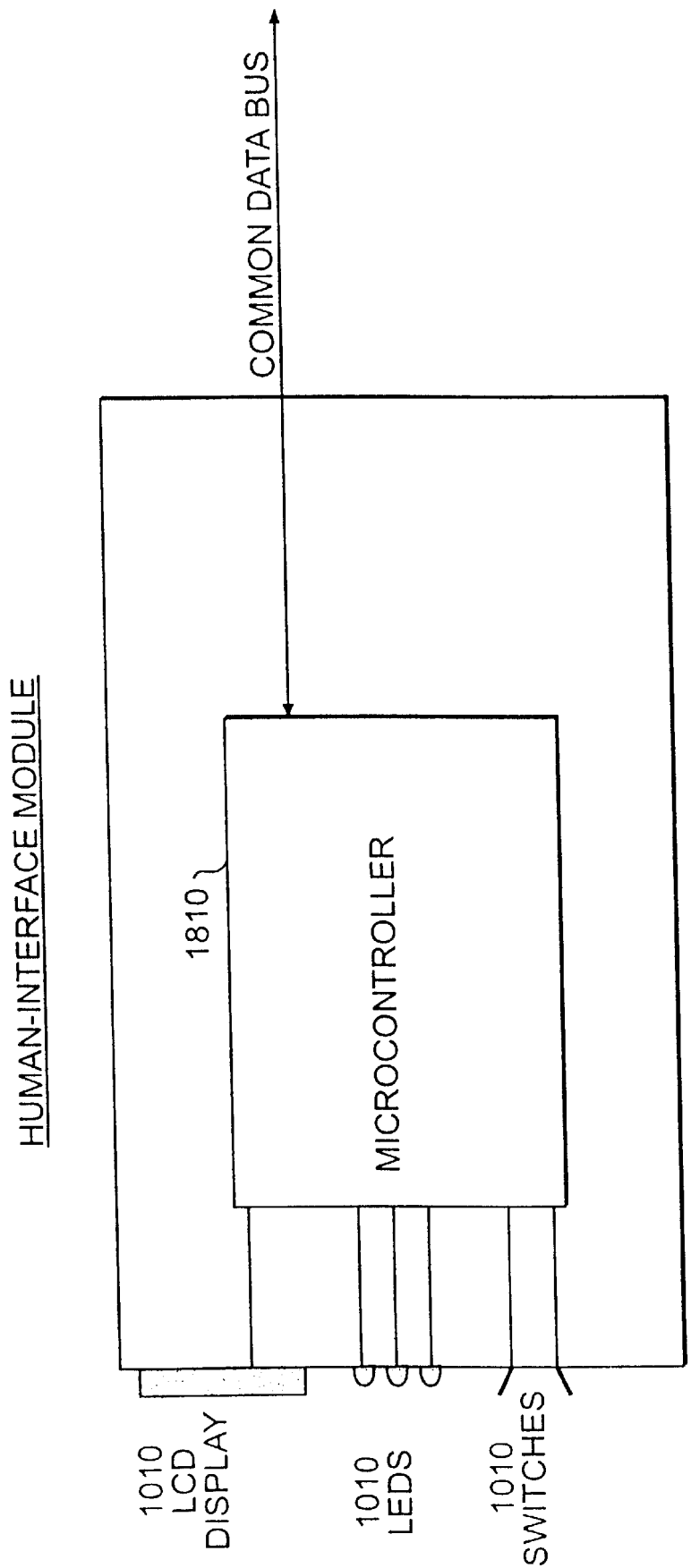
FIG. 18 is a block diagram illustrating a human-interface module.

FIG. 10 illustrates human interface modules 1000 that are designed to support interaction with users. These modules may be used in any number or combination in a stack. These modules accept messages containing information to be presented to users and/or generate messages in response to user actions. Human interface modules may be designed in a number of configurations, depending on the intended use of the module. For example, a normally configured module also may have controls or displays 1010 mounted along any of the four narrow edges. FIG. 18 is a further illustration of the human-interface module.

Figure 12:
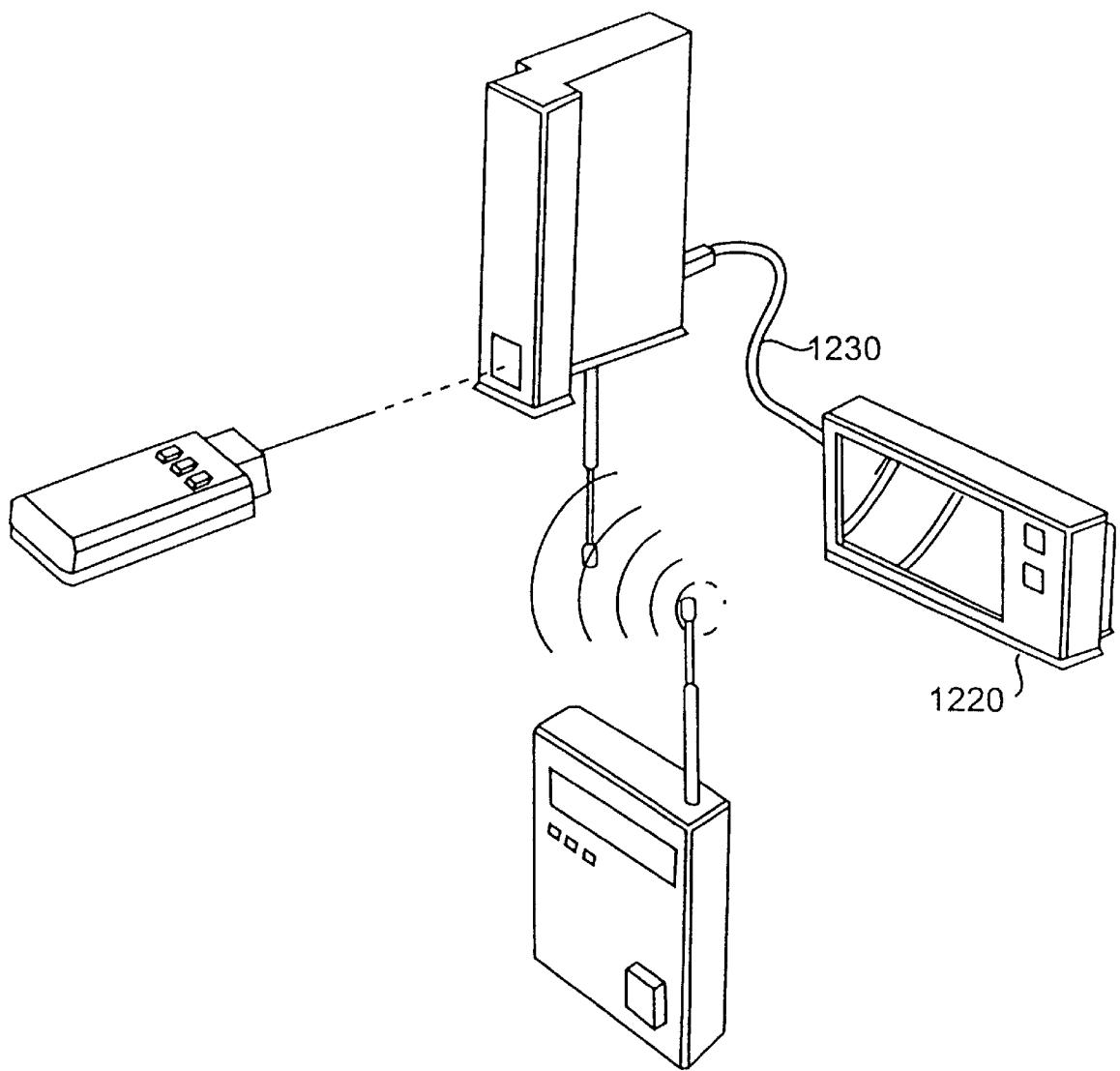
FIG. 12 illustrate external controls connected to a module of the present invention.

A normally configured human interface module may also have external controls and/or displays connected to it via a wired or wireless (RF or IR) link. For example, an LCD display 1220 may be connected to a module via a wire 1230 as shown in FIG. 12, and mounted at a convenient location remote from the stack. The LCD display could, in addition, be fitted with a touch-sensitive screen, in which case it could be used both for user input as well as displayed output. Alternatively, the wired connection could be replaced with a 2-way wireless RF link, as shown in FIG. 12. In this way, the remote I/O display is mounted anywhere convenient, as, for example, when used as a controller for a home-automation device where it might be mounted at bedside or by an exit door.

Figure 11:
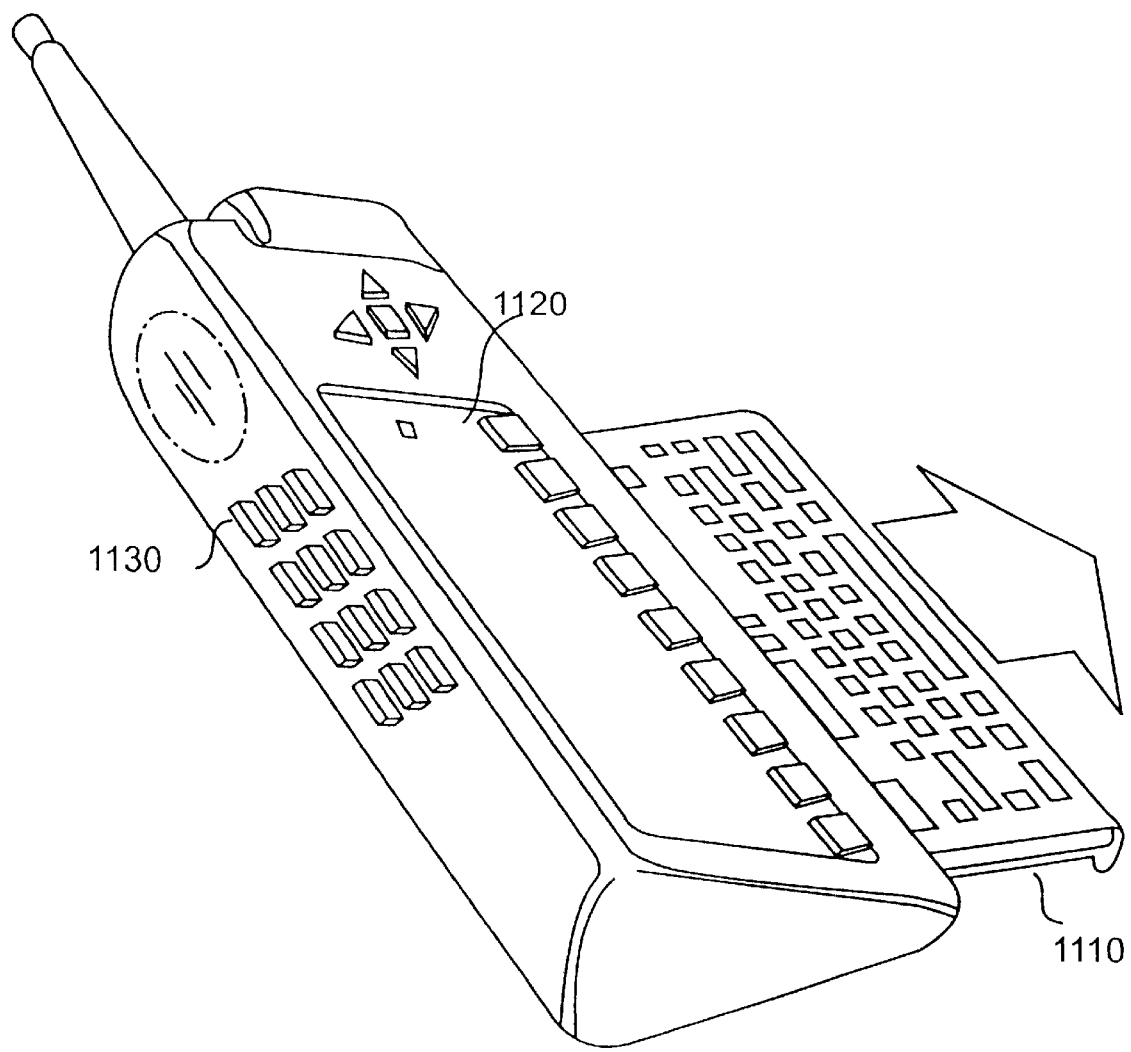
FIG. 11 is a universal remote I/O device of an embodiment of the present invention illustrating a combination wireless keyboard, LCD display and cordless telephone.

Another aspect of the present invention is a combination shown in FIG. 11, which is a wireless keyboard 1110, LCD display 1120, and cordless telephone 1130. The combination is connected to a module via a 2-way RF link, such a controller could serve as a universal remote I/O device for a personal computer, an interactive television set-top box, or a home automation/communication system.

Human interface modules also may contain a CPU and software implementing an entire graphical user interface. Such a module could be connected to a CRT or a large LCD display plus a keyboard and/or pointer device. Such a module, along with a properly programmed control module, and other required modules, constitute an entire computing system that can be field-configured for a great many special applications.

Human interface modules may be configured with only one bus connection, with the remaining surface containing a display, physical controls, or other means for users to interact with the stack. As shown in FIG. 6, such modules must be placed at the top of the stack.

OPERATION

I. Stack Bus Architecture

To maximize the ease of use of the invention by non-technical users, the architecture of the system is designed to be completely self-configuring having no required configuration settings, no other special setups, and only a minimum of restrictions concerning how modules are assembled together. In general, any combination of modules can be combined into a single stack and will operate properly.

Since most signals are sent among modules via bi-directional bus lines, this property is intrinsic for these lines. For the few signals that cannot be sent on bus lines, the firmware of each slave module may be configured to auto-sense the "upstream" direction toward the base module and assign input and output logic accordingly. One such signal is the "Token Pass," which will be described later. Before describing the busses, bit protocol must be defined.

Bit Protocol

Figure 13:
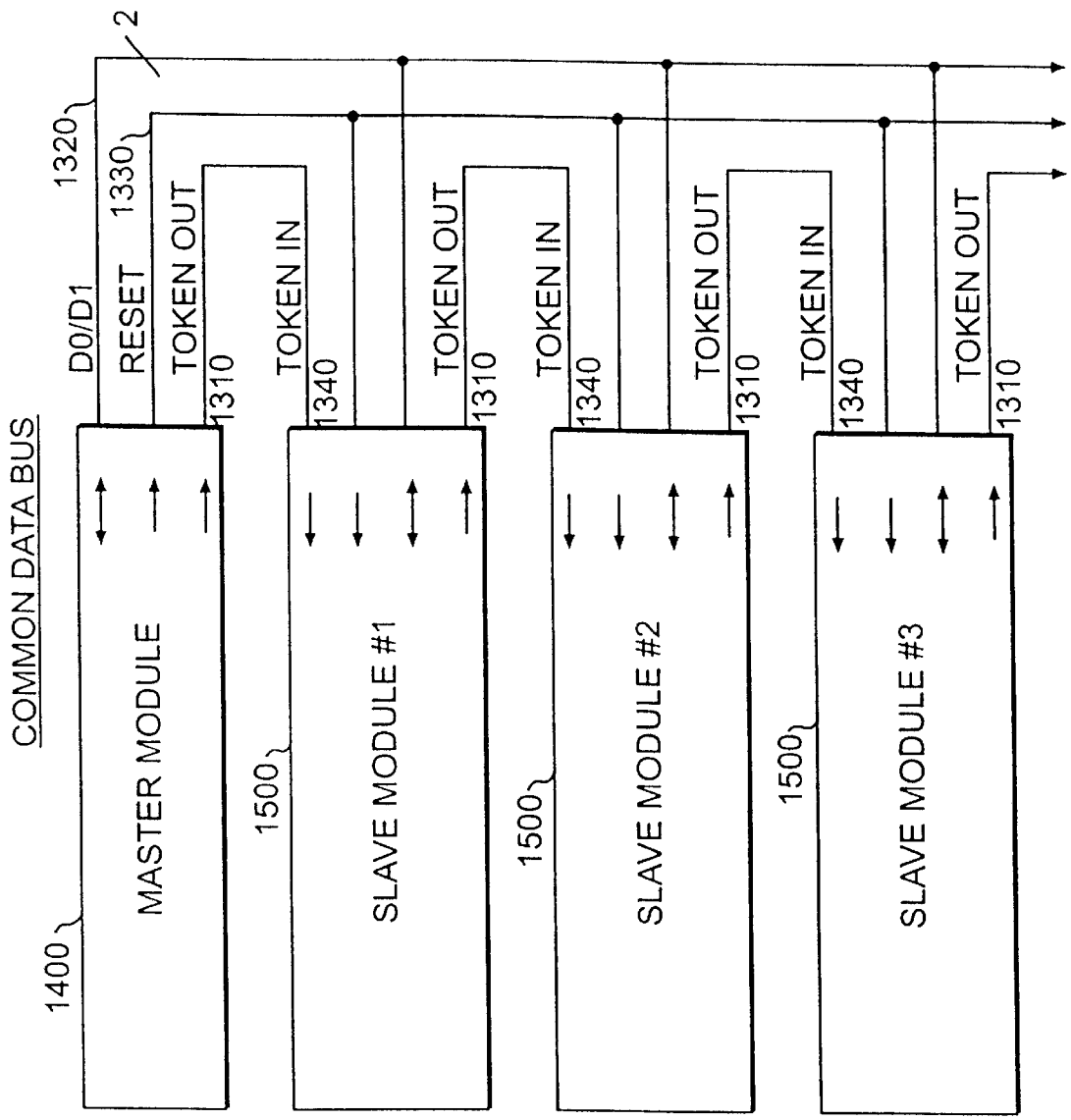
FIG. 13 is a block diagram illustrating a connector data bus.

The bus used to communicate among modules can be implemented in a number of ways. For example, an 8 bit parallel synchronous bus can send command and data bytes between the master and slave modules. In the preferred embodiment, however, the primary control and data bus is implemented as a 4-wire asynchronous handshake bus. The four lines are shown in FIG. 13 and are defined as follows:

D0/D1 are two data lines for handshake data transfer, shown as 1320 in FIG. 13. D0 and D1 are tristate bus lines, pulled high by the master module and asserted low by master or slave module.

TOKEN is a one bit channel used to pass the token up the stack from module to module. TOKEN is the only required signal that is not a bus line. Rather, pins on both side of the modules are connected to a TOKEN-IN pin 1340 and a TOKEN-OUT pin 1310 on the module's micro controller, thus permitting slave modules to hold and pass the token on the master's command. Token passes are indicated by a change of state on a module's token-in line. This change will be low-to-high on alternate passes of the token up the bus, and high-to-low on the others. Thus, the significance of the token pass is the transition and not the actual level of the signal. This "non-return-to-zero" protocol greatly simplifies the token-passing logic within modules.

RESET (1330 in FIG. 13) is used to reset all modules to their initial state. RESET is a bus signal controlled by the master module 1400 and connected to appropriate reset circuits on each slave.

Bits are passed between master and slave modules according to the following sequence:

a. As long as a slave module 1500 does not have the token, D0 and D1 are ignored.

b. When the slave module 1500 receives the token via a change of state of its TOKEN-IN line 1340, the slave module 1500 begins to monitor D0 and D1 1320.

c. If the master module 1400 wishes to send a 0 bit to the slave module 1500 that currently has the token, it asserts D0 by pulling the normally-high bus line low. If the master module 1400 wishes to send a 1 bit, it asserts DO.

d. The slave module 1500 acknowledges receipt of the data bit D0 by asserting the other data line D1.

e. The master module 1400 acknowledges the slave module acknowledgment by releasing the data line DO.

f. The slave module 1500 completes the transaction by releasing the other data line D1.

g. The master module 1400 waits until both data lines D0 and D1 1320 are low before sending the next bit.

If the slave module 1500 wishes to send data to the master module 1400, it does so via a "line turn" protocol, as follows:

a. After the master module 1400 releases the data line D1 in step "e" in the above sequence, the slave module 1500 reasserts D1 before dropping the other data line DO.

b. At this point, the protocol proceeds as above, starting with step "d", but with the roles of master module 1400 and slave module 1500 reversed.

An advantage of this asynchronous handshake bit protocol is that it has no timing dependencies between modules. Thus, different modules operating at greatly different internal speeds can coexist and inter-operate on the same stack without any need for synchronization. Furthermore, transactions automatically occur so as to take advantage of the maximum processor speed available between any pair of modules. This feature will permit the introduction of higher-performing modules as technology advances without sacrificing backward compatibility with older modules.

A second advantage of this scheme is that it requires only four I/O pins of the micro controller in each module. This permits modules to be implemented using very inexpensive devices, and maximizes the number of I/O pins available for other module functions.

The system architecture defines a number of separate logical busses, each assigned a unique set of pins in the common connector. The architecture is extensible in that new logical busses can be defined in the future as the need arises. The currently defined busses include the following:

A. Common Data/Control Bus

This bus is used to send control information and low-bandwidth data among modules. All modules implement this bus. The structure of the common data/control bus is shown in FIG. 13. In order for data to be directed to individual modules, it is necessary that each module be assigned a unique address within the stack. To accomplish this without the need for users to configure each module, a Token Pass scheme is used to permit the addressing of the modules in terms of their position on the stack relative to the stack's master module.

When the system begins operation, master module 1400 generates a token out signal 1310 and passes it to the slave module 1500 on the stack. The master module 1400 and slave module 1500 can then exchange information over the bus. When these transactions are complete the master module 1400 sends a command to the slave module 1500 to pass the token to the next slave module up the stack. When the token reaches the top of the stack, the master module's "token pass" command will remain unacknowledged and, after a time-out period, the master module 1400 will store the number of slave modules in the stack in its memory. It will then repeatedly generate a new token, pass it up the stack to each slave module, and perform any necessary transactions along the way.

Each different type of module is assigned a "module ID" number at time of manufacture, and can report this ID to the base module upon request. In this way, software can be written that can configure itself automatically based on the number and types of modules currently present on the stack.

Data/Command Protocol

The above-described protocol implements a reliable half-duplex bit stream upon which the second-level data and control protocol can be layered.

In the preferred embodiment of the present invention, the second-level protocol uses a variable-length opcode scheme in order to optimize bus performance. In this embodiment, the one-bit opcode "0" is used to designate "token-pass." This choice optimizes the performance of the bus since this transaction is by far the most common one.

Opcode "10" is used to initiate a data byte transfer.

Figure 19:
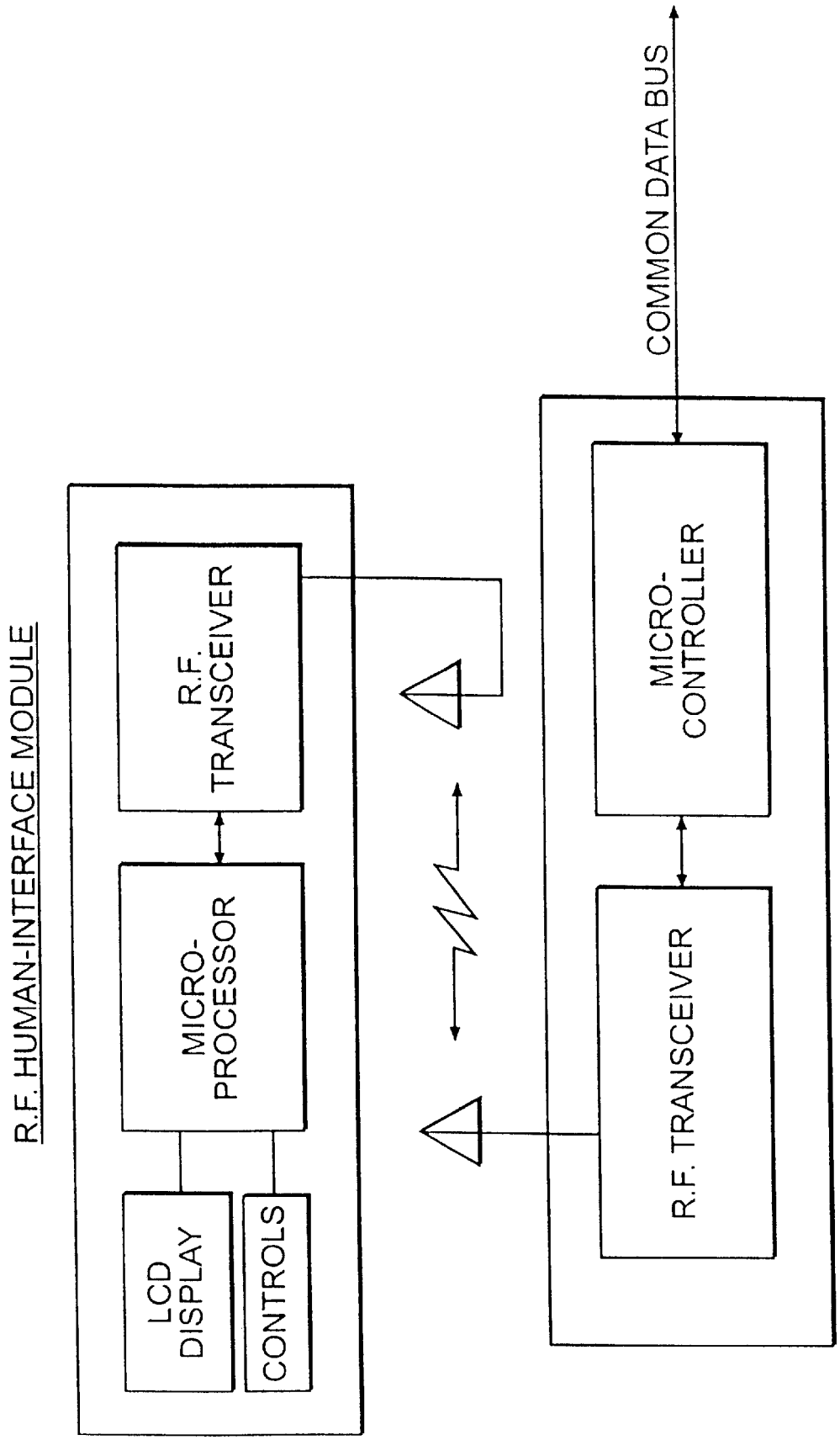
FIG. 19 is a block diagram illustrating an R.F. human-interface module.

Similarly, opcode "110" or "1110" can be assigned to other operations. An example of the data flow in a stack controlled by an external host is shown in FIG. 19.

B. Control Module Bus

A separate control bus is provided for use by control modules. These modules must be capable of examining the information generated by other modules in the stack and optionally absorbing those data before they are sent by the base module to an externally-connected device.

Three additional bus lines are used for communication between base modules and any control modules on the stack. Each time the base module causes the token to be passed, it asserts one of these lines. The control module then acknowledges the token pass by asserting both of the remaining lines. In this way, the control module can keep a count of the current position of the token. If the master determines that no data are available from the current module, it will drop the first line and terminate the transaction. If data are available, however, the master must wait for the control module to assert whether it desires to absorb the input from the currently addressed module. If the control module does, it drops the second data line, otherwise the control module drops the third line. The base module then drops the first line and in response, the control module drops the last line.

At this point, the master knows whether a control module desires the received data. If the control module does, the master sends data up the stack to the control module using the common data/control bus. If the control module doesn't, the master may send the data out the host communications port to an external host.

Figure 20:
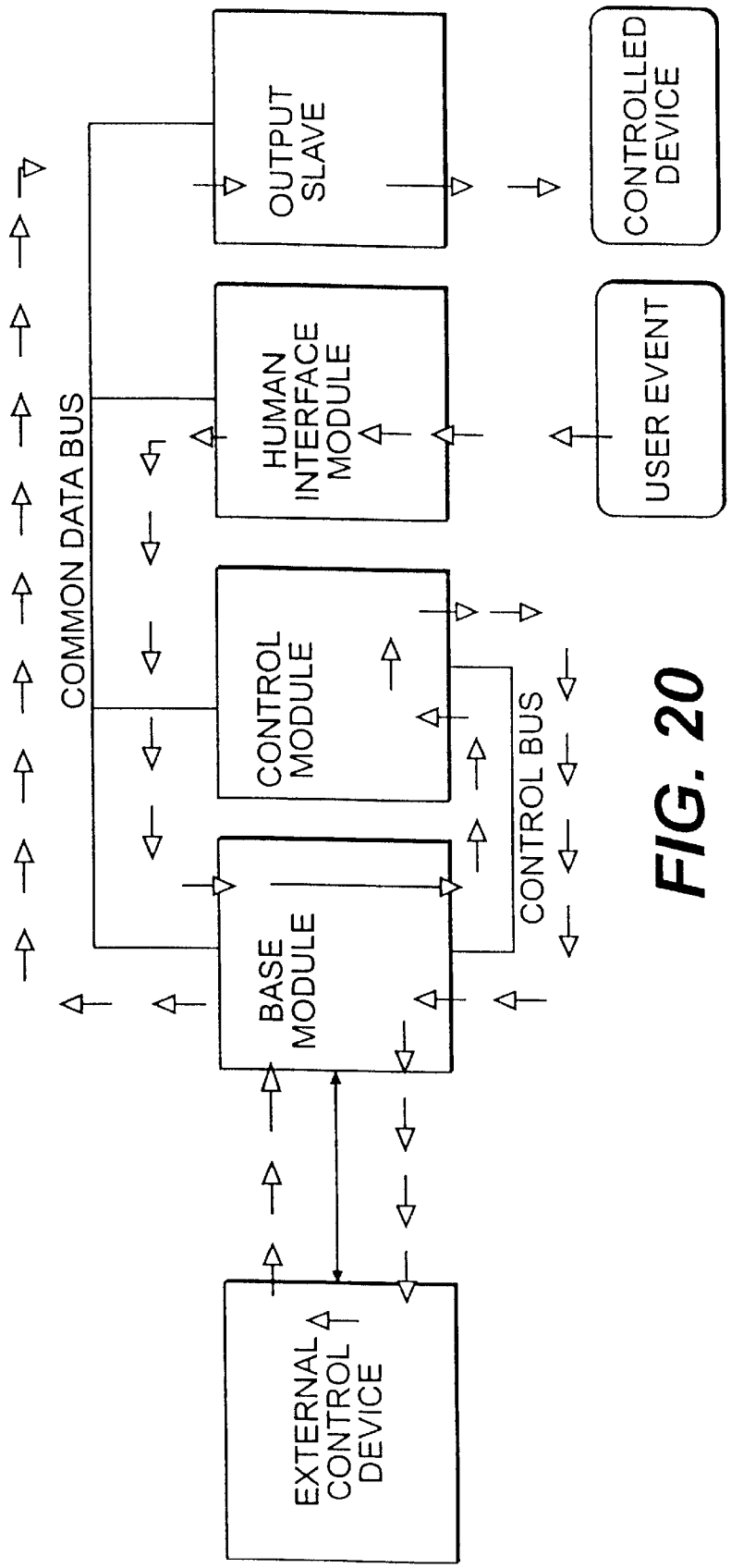
FIG. 20 is a block diagram illustrating data flow in the present invention that is controlled by an external control module.
Figure 21:
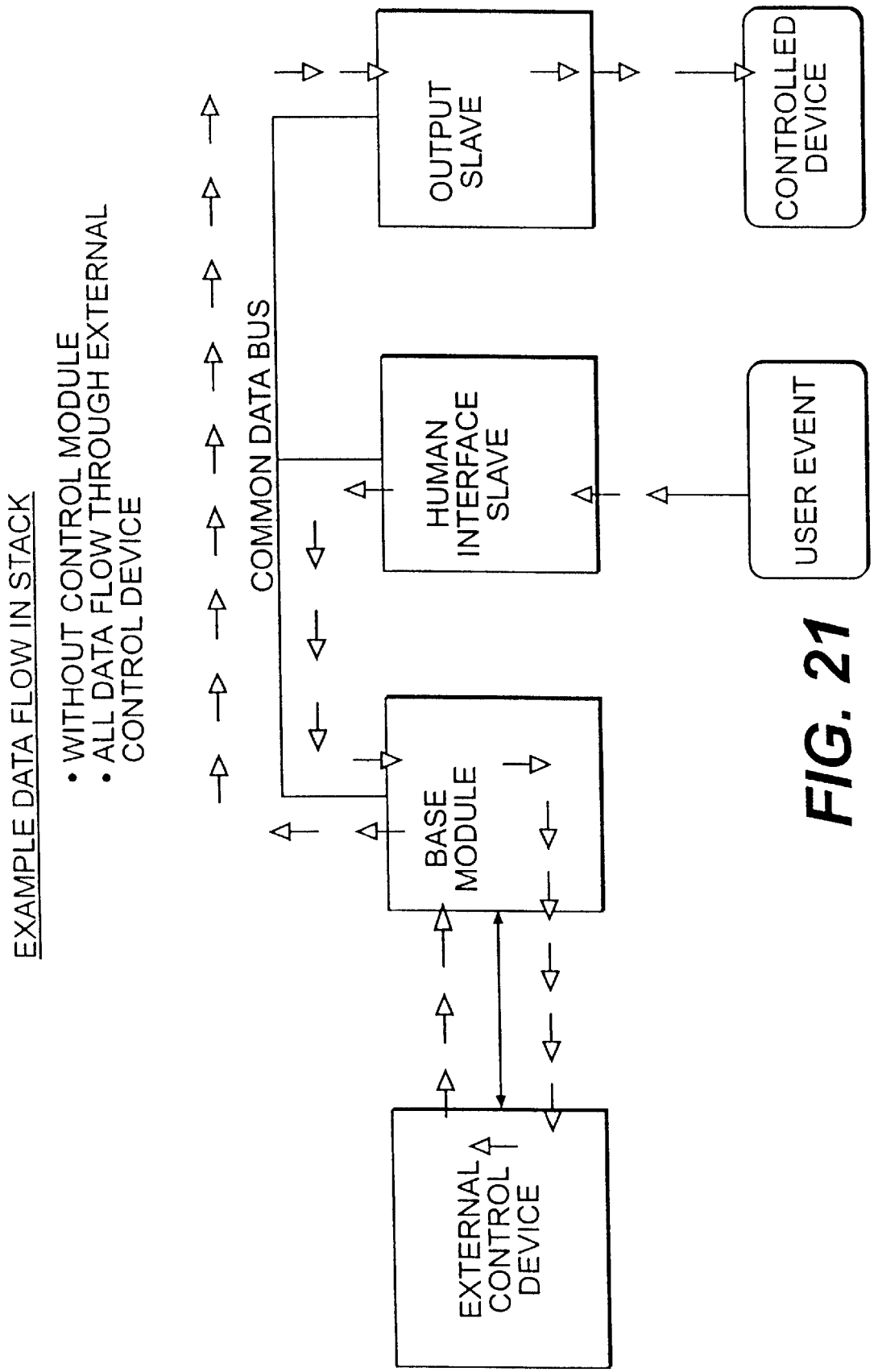
FIG. 21 is a block diagram illustrating data flow in the present invention that is controlled by an internal control module.

An example of the data flow in a stack controlled by an internal control module is shown in FIG. 20.

C. High-Speed Data Bus

In the preferred embodiment, an 8-bit parallel, synchronous bus channel is provided for high-speed bursts of data among modules. The channel can be reserved by a slave module whenever the channel is idle and the module holds the token. This method prevents multiple modules from contending for the bus at the same time. Once a slave module has the channel, it keeps it until the transaction is complete. Once the transaction is complete, the slave module immediately releases the channel via a control line. All modules must pass this bus, but the ability to use it is optional.

D. Audio Bus

Figure 24:
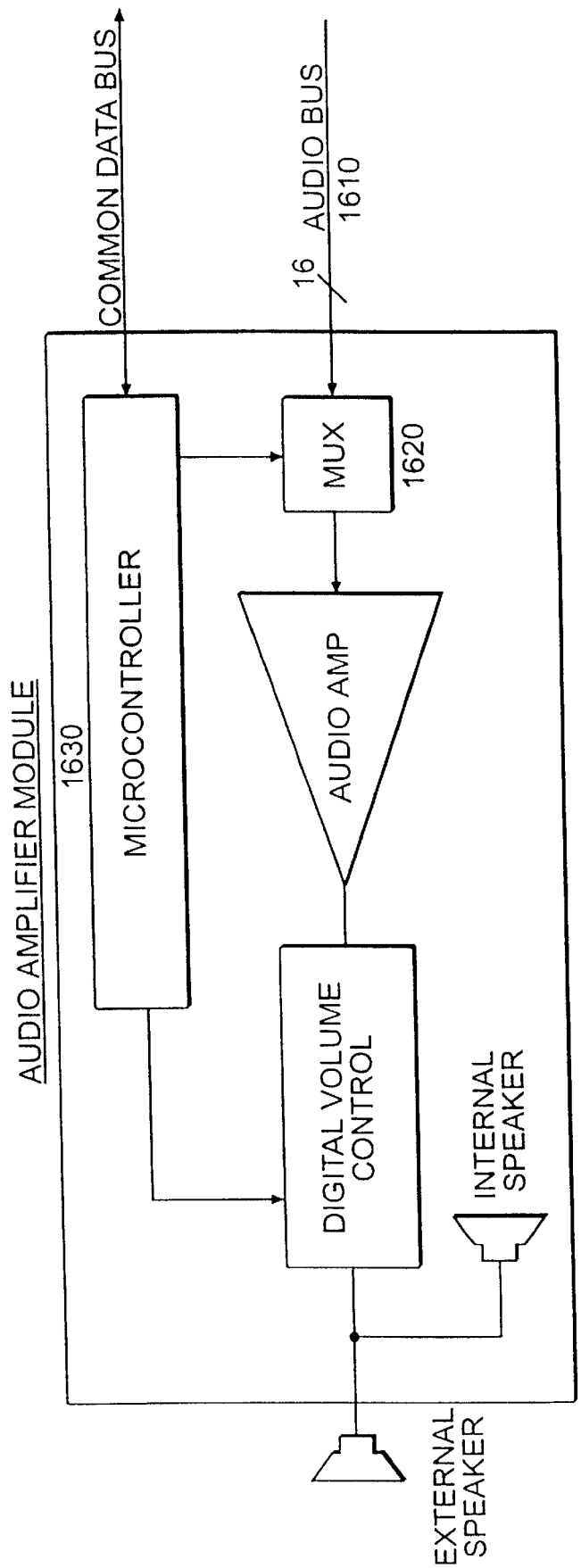
FIG. 24 is a block diagram illustrating an audio amplifier module.

A number of bus lines are reserved for an analog or digital audio bus that permits any module to distribute audio information to any other module. The lines are used to implement a number of separate audio "channels", thus permitting several different audio connections among modules simultaneously. In an example embodiment shown in FIG. 24, 16 audio channels on an audio bus 1610 are defined. Support of these channels is optional, therefore, modules that do not support them do not pass them, thus permitting the presence of multiple, independent sets of audio busses in a single stack by separating them by at least one non-audio module.

Individual modules may insert audio onto channels, receive audio from channels, or both. The audio components of modules are connected to channels via an analog multiplexer 1620 controlled by the module's micro controller 1630, thus permitting any module to connect to any channel via commands from higher-level software.

Figure 22A:
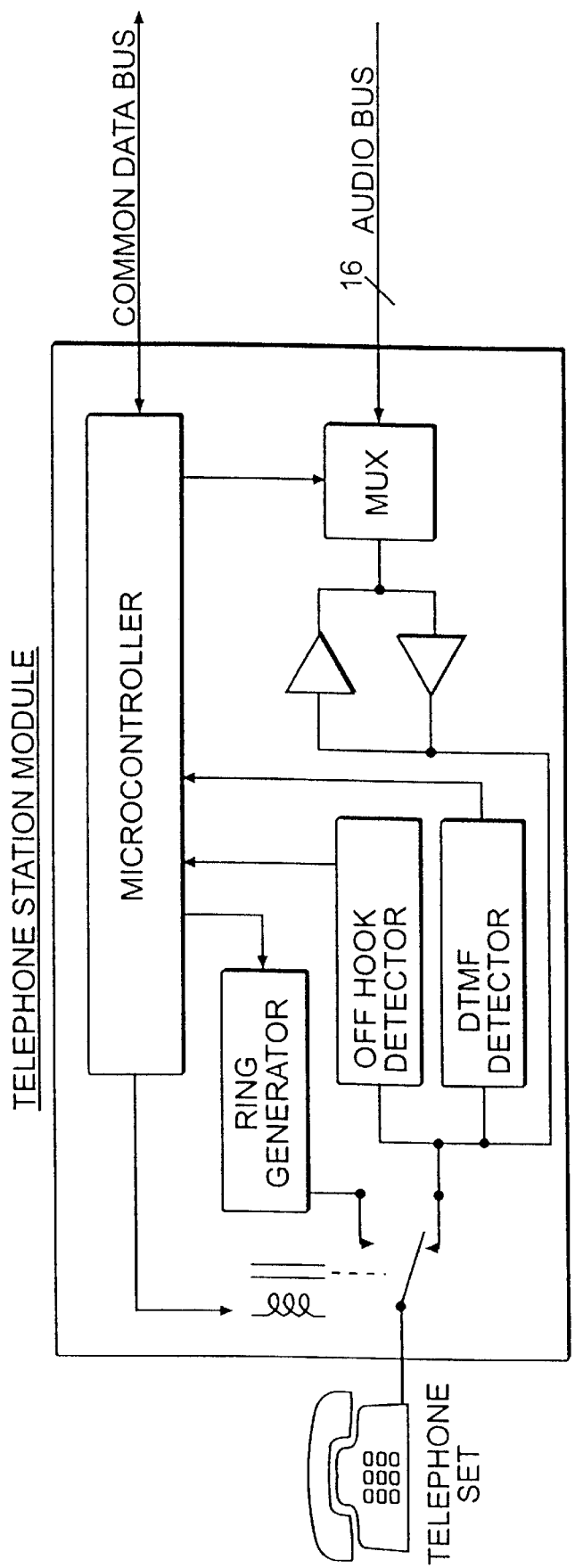
FIG. 22A illustrates a station telephone module.
Figure 22B:
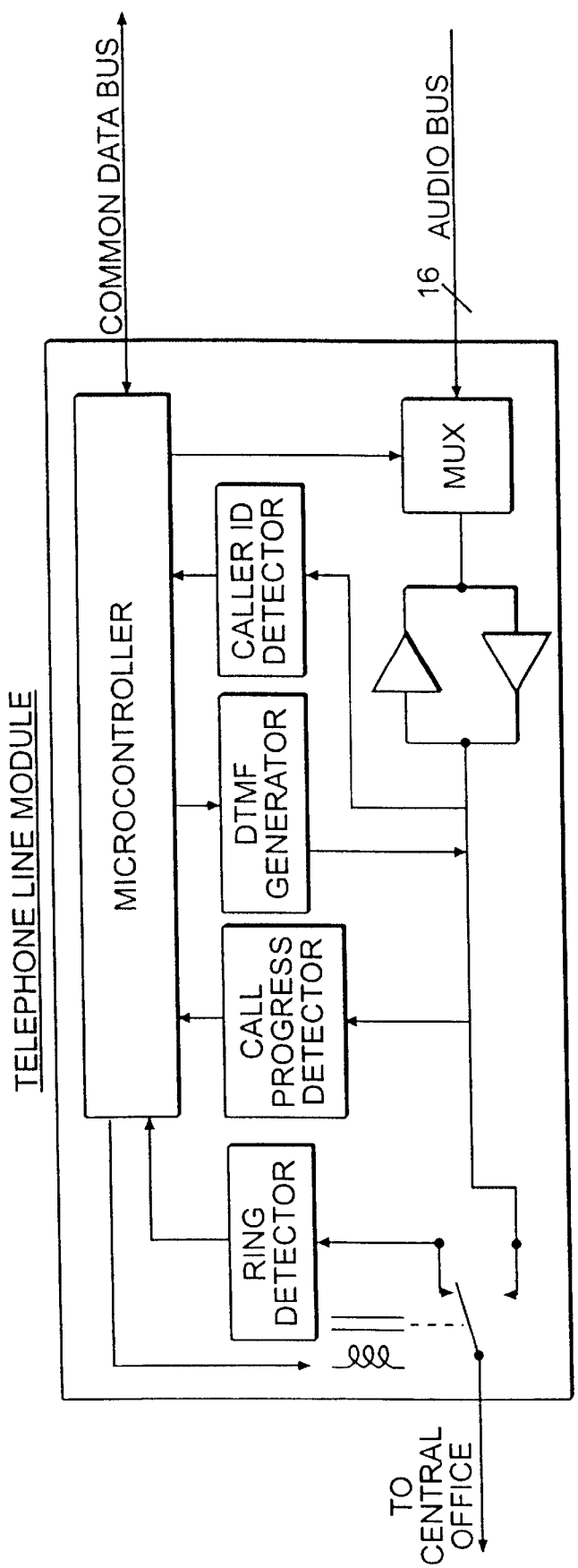
FIG. 22B illustrates a line telephone module.

Modules that are capable of inserting audio on channels must do so via a signal-insertion circuit that is capable of mixing its audio into any other audio signals that may be present on the selected channel. Any number of approaches may be taken in the design of this circuit, as will be apparent to those skilled in the art. This permits the audio channels to be used in a bi-directional mode (i.e., with two modules each simultaneously transmitting and receiving audio via the same channel). This allows such applications as the creation of a modular, extensible telephone Private Branch Exchange (PBX), assembled from "station" and "line" telephone modules. Examples of the design of station and line modules are shown in FIGS. 22A and 22B.

E. Video Bus

Figure 23:
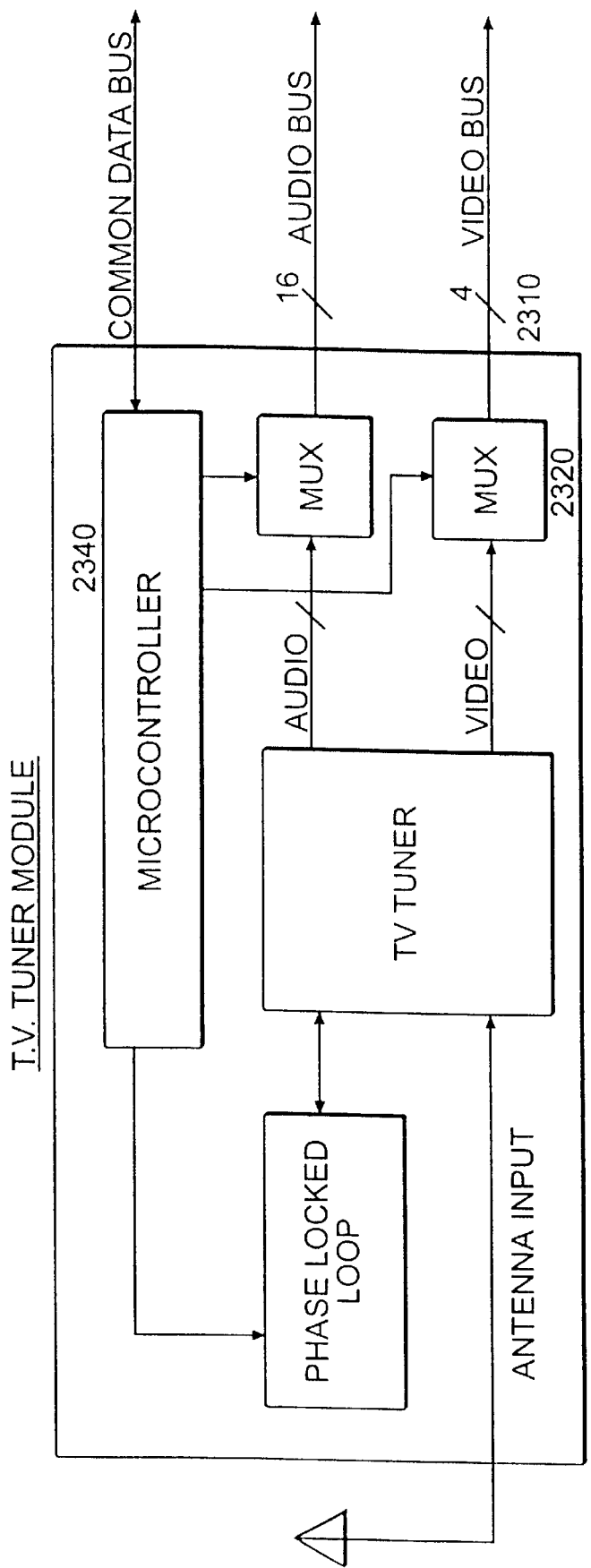
FIG. 23 is a block diagram illustrating a television tuner module.

A number of bus lines are reserved for use in implementing channels capable of distributing baseband or digital video signals among modules. Modules are capable of sourcing video, sinking video, or both, and is shown in FIG. 23 as, for example, a T.V. Tuner module. As in the audio channels, the module selects a video channel via an analog multiplexer 2320 under the control of its microprocessor 2340. In an example embodiment, four composite video channels 2310 are defined using four signal pins and four ground lines. An alternate embodiment includes twice as many lines and the luminance and chromatic information are sent on separate lines.

II. Host Communications Protocol

Base modules optionally may be connected to external devices, such as personal computers and cable boxes. In one embodiment, this connection is made via an RS-232 serial port. Provisions must be made for the host computer to direct data and control data to any module. In a preferred embodiment, this is accomplished by a byte-oriented protocol in which the host sends byte-pairs to the base module. The first byte is the address of the module to which the data is to be sent, and the second byte contains the data to send. The high-order bit of each address byte is always set to one. This permits the byte pairs to be re-synchronized at any point at which a data byte less than 128 is sent to any module. The base module ignores data byte "0", so it is possible to explicitly re-synchronize the byte stream at any time by sending the byte pair whose values are 128 (address of base module) and 0.

Alternatively, any other standard or custom communication interconnect standard such as SCSI or USB may be employed for the connection between base modules and hosts.

Data sent to the base module is interpreted as opcode information to the base module. Various opcodes may be defined. In particular, one opcode indicates that the following address/data pair be sent to the addressed module as a command rather than as data. This provides out-of-band signaling capability to modules for purposes of control and configuration of the modules.

Communication from the modules to the host occurs in the same manner, with the base module sending byte pairs consisting of the source module address followed by the data byte.

III. Programming

In order for a stack of modules to perform useful functions, it is necessary to compose a set of software routines which direct the flow of information from module to module and between modules and outside devices. In the simplest case, individual modules communicate with one or more processes running on an external host computer using the host communications protocol. The external host attaches module addresses to each data byte and the base module distributes the data to the appropriate modules. The reverse happens when data flows from the modules to the external process or processes. In this way, the external host can receive data from modules, process them, and direct data back to the modules. If more than one process on the host wishes to communicate with modules, a multiplexing/demultiplexing process on the host computer can allow the processes to share the master module's communications channel.

A second embodiment of this invention involves the use of one or more control modules in the stack itself. These modules can store and execute the control process(es) and thus perform a role identical to that of the external host. In this mode, control modules indicate to the base module their interest in data from particular modules, in which case the base module directs data from those modules to the control module rather than the external host.

These two modes of operation are not mutually exclusive: a stack can have one or more control modules and still communicate with the external host. In addition, control modules can communicate with one another and with the external host.

Although any conventional programming technique can be used to program control processes, the preferred embodiment employs a message-passing paradigm coupled with a data-flow-like architecture to define the flow of information among modules and processes, which is explained below and will be apparent to those skilled in the art. In this method, modules, external processes, and user-defined scripts are all modeled as a single abstraction called a "node". All communications among nodes is done via packets of data known as "messages." Messages consist of one or more bytes of data and have a type. Examples of types include strings, bytes, integers, times, etc. Each node has one or more inputs and one or more output. Nodes are capable of accepting data of only specific data types. Any packets of the wrong data type arriving at the input of a node are coerced via standard type conversion routines into an acceptable type (it is permissible for a particular coercion to result in a null message). Thus, it is permissible for the output of any node to be connected to the input of any other node. The output of any node may be fanned out to any number of node inputs.

Since modules communicate via diverse and arbitrary sequences of bytes, it is necessary for a special process to be associated with each module which converts these byte sequences to and from standard typed messages. This is done via special parser routines associated with the modules, such routines will be apparent to those skilled in the art. Each module type must have its own parser routine. It is these parser routines which permit the hardware modules to be treated as nodes in the programming environment.

External processes are presented to the programming environment via special multiplexer/demultiplexer routines that can define separate communications channels between nodes and the external processes. These routines will be apparent to those skilled in the art.

Finally, compute nodes consist of scripts, which are small programs defined in a programming language and which process and generate messages. The script of a node executes whenever it has received appropriate messages enabling it to do so. It may store previously received messages as internal state. The result of script execution may be to generate one or more output messages.

Nodes are interconnected via "links", which are simply virtual wires along which messages flow. If there is a link connecting any output with any set of inputs, those inputs always receive a copy of any messages produced by the output.

The activation of nodes (and the execution of any script associated with the nodes) is completely controlled by the flow of messages through the network of links. Each node is logically independent, and the execution of script within nodes happens asynchronously. Since control is asynchronous, it is possible for a new message to appear at the input of a node before processing of an old message is complete. In this case, the node may perform one of several actions: (a) it may ignore the new message; (b) it may queue the message to be processed later; (c) it may process the new message in parallel with the old one in a separate thread. The choices will depend on the nature of the node and the current state of its internal resources.

Figure 26A:
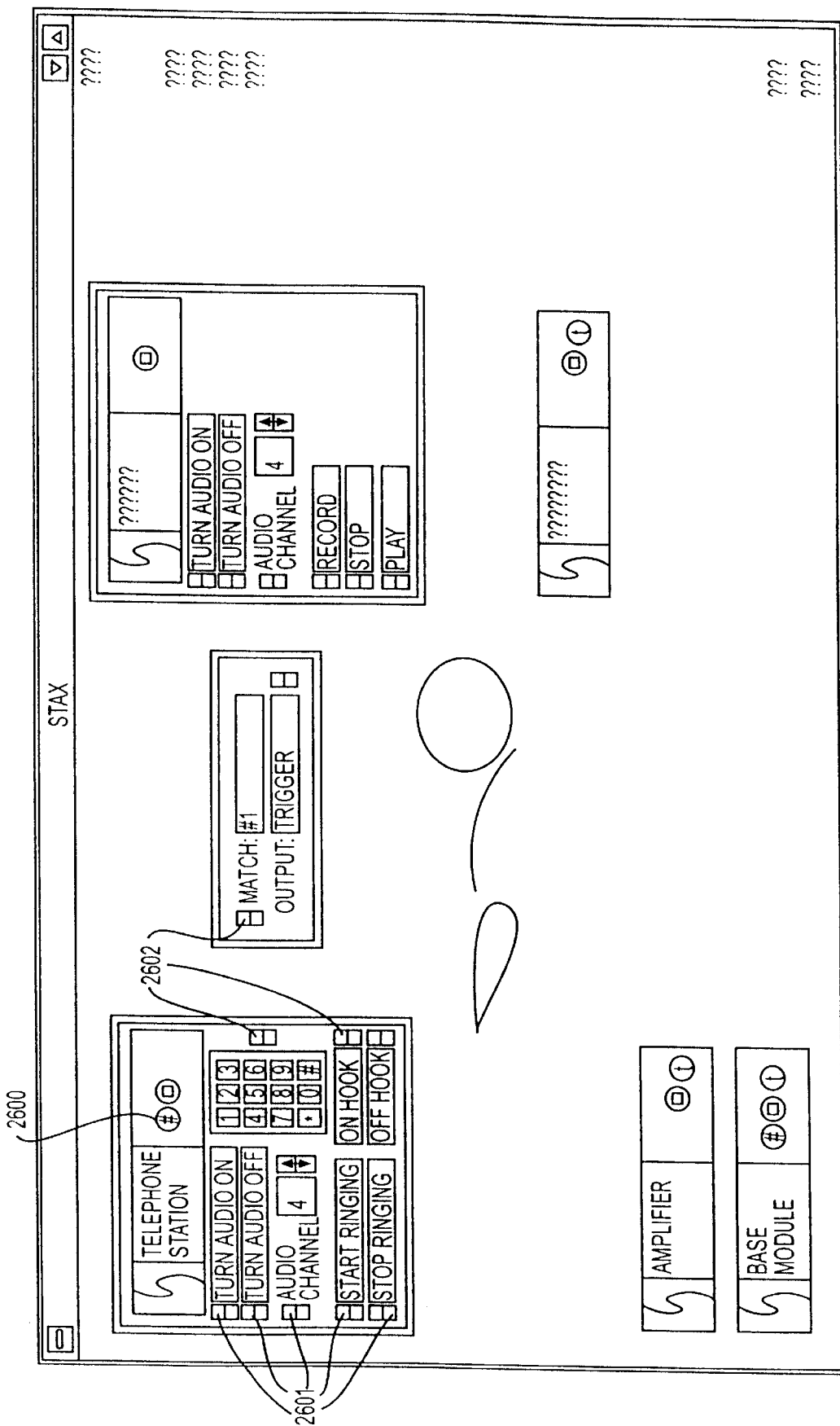
FIG. 26A is a graphical computer display illustrating the configuration of nodes and links.
Figure 26B:
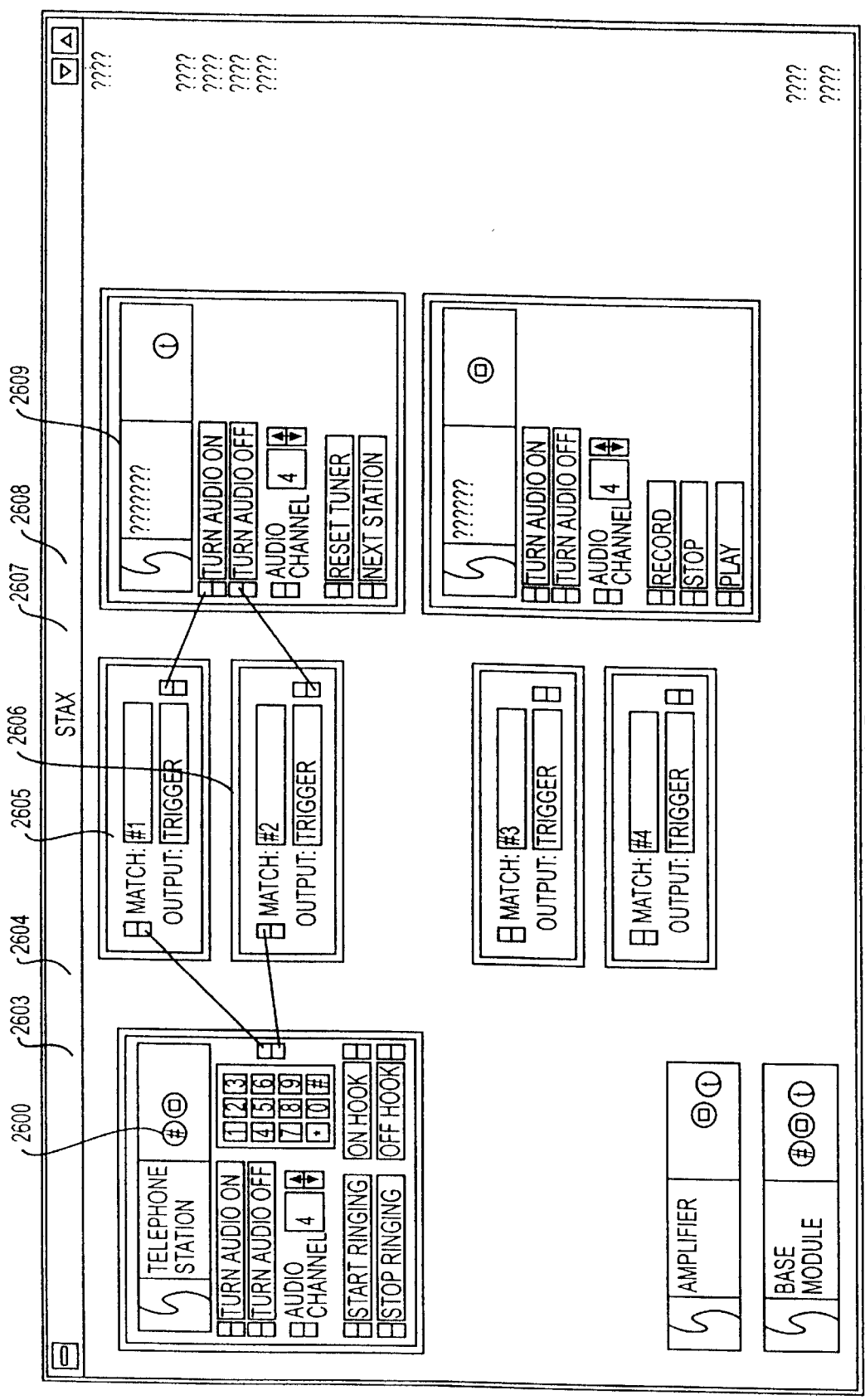
FIG. 26B is a graphical computer display illustrating the configuration of nodes and links.

Message passing architectures are a well-established technique in computer science, and data flow architectures have typically been applied at the hardware instruction level in parallel processing computer architectures. However, the joint application of these two techniques applied to implement a high-level scripted distributed control environment is novel. In the preferred embodiment, configuration of nodes and links are created by a direct-manipulation graphical programming environment. As shown in FIGS. 26A and 26B nodes are represented in iconic form on a graphical computer display. The nodes can be dragged and arranged at will. For example, in FIG. 26A, screen object 2600 is a node representing a telephone station module in iconic form. This node has various inputs (2601) and outputs (2602). Links are defined by dragging lines from node outputs to node inputs. For example, in FIG. 26B, links (2603, 2604) have been drawn from the keypad output of the telephone station module (2600) to the input of software "match" nodes 2605 and 2606. In turn, the outputs of these nodes are connected via links 2607 and 2608 to the "audio on" and "audio off" inputs of FM turner node 2609. This network of links would permit the audio of the FM tuner to be turned on or off using keys of a standard telephone attached to telephone station module 2600. Nodes corresponding to the modules of a stack appear automatically when they are plugged into the stack, or when the stack is connected to the computer supporting the graphical computer display. New nodes can be created and scripts entered into them. The system may also come equipped with pre-defined computational nodes performing common operations.

After a configuration is defined, it may be interpreted or compiled into a control process. This process may be executed on the host computer or downloaded into a control module where it can be executed in a stand-alone stack. In the case of control modules that have non-volatile memory, the downloaded process description can be stored indefinitely, thus permitting compiled processes to be sold in the form of downloaded modules. This permits systems integrators and "power users" to create specialized appliances comprised of various modules plus custom-programmed control modules.

It will be apparent to those skilled in the art that various modifications and variations can be made in the control system of the present invention without departing from the spirit or scope of the invention. Thus, it is intended that the present invention cover the modifications and variations of this invention provided they come within the scope of the appended claims and their equivalents.

What is claimed is:

1. A modular system for controlling electronic devices in which flow of data among the electronic devices is determined via a drag-and-drop graphical user interface having graphical representations of the devices as well as scripted software devices that are interconnected via drag-and-drop links, such graphical representations of the links being used to describe the data flow among the electronic devices.

2. The modular system as described in claim 1 in which the dataflow is executed via a process on an external computer, wherein the process includes execution of a configuration of devices, simulation of devices, and management of dataflow.

3. The modular system as described in claim 1 in which the dataflow is downloaded into a control module for execution independently of any external computer, wherein the execution includes execution of a configuration of devices, simulation of devices, and management of dataflow.

* * * * *